(12) United States Patent
Zi et al.

(10) Patent No.: US 12,437,992 B2
(45) Date of Patent: Oct. 7, 2025

(54) METHOD OF MANUFACTURING A SEMICONDUCTOR DEVICE

(71) Applicant: TAIWAN SEMICONDUCTOR MANUFACTURING COMPANY, LTD., Hsinchu (TW)

(72) Inventors: An-Ren Zi, Hsinchu (TW); Ching-Yu Chang, Yuansun Village (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 819 days.

(21) Appl. No.: 17/246,493

(22) Filed: Apr. 30, 2021

(65) Prior Publication Data
US 2022/0351964 A1  Nov. 3, 2022

(51) Int. Cl.
| | | |
|---|---|---|
| *G03F 7/11* | (2006.01) | |
| *G03F 7/004* | (2006.01) | |
| *H01L 21/027* | (2006.01) | |
| *H01L 21/3105* | (2006.01) | |
| *H01L 21/3115* | (2006.01) | |

(52) U.S. Cl.
CPC ........ *H01L 21/0274* (2013.01); *G03F 7/0044* (2013.01); *G03F 7/11* (2013.01); *H01L 21/31058* (2013.01); *H01L 21/3115* (2013.01)

(58) Field of Classification Search
CPC .... G03F 7/0042; G03F 7/0043; G03F 7/0044; G03F 7/11
See application file for complete search history.

(56) References Cited

U.S. PATENT DOCUMENTS

| | | | | |
|---|---|---|---|---|
| 5,939,236 | A * | 8/1999 | Pavelchek | H01B 3/46 430/273.1 |
| 6,274,289 | B1 * | 8/2001 | Subramanian | G03F 7/168 430/327 |
| 8,796,666 | B1 | 8/2014 | Huang et al. | |
| 9,093,530 | B2 | 7/2015 | Huang et al. | |
| 9,213,234 | B2 | 12/2015 | Chang | |
| 9,223,220 | B2 | 12/2015 | Chang | |
| 9,256,133 | B2 | 2/2016 | Chang | |
| 9,310,684 | B2 | 4/2016 | Meyers et al. | |
| 9,536,759 | B2 | 1/2017 | Yang et al. | |
| 9,548,303 | B2 | 1/2017 | Lee et al. | |
| 9,857,684 | B2 | 1/2018 | Lin et al. | |
| 9,859,206 | B2 | 1/2018 | Yu et al. | |
| 9,875,892 | B2 | 1/2018 | Chang et al. | |
| 2004/0126715 | A1 * | 7/2004 | Larson | G03F 7/094 430/325 |
| 2007/0092829 | A1 * | 4/2007 | Noelscher | G03F 7/0035 430/270.1 |
| 2007/0117041 | A1 * | 5/2007 | Noelscher | G03F 7/094 430/311 |
| 2012/0088369 | A1 | 4/2012 | Weidman et al. | |
| 2014/0272711 | A1 * | 9/2014 | Bristol | G03F 7/0045 430/323 |
| 2017/0090287 | A1 | 3/2017 | Tong et al. | |
| 2017/0168398 | A1 * | 6/2017 | Zi | G03F 7/0042 |
| 2020/0050109 | A1 * | 2/2020 | Ho | H01L 21/0274 |
| 2020/0066536 | A1 * | 2/2020 | Yaegashi | G03F 7/0042 |

FOREIGN PATENT DOCUMENTS

| | | |
|---|---|---|
| JP | 2006-058404 A | 3/2006 |
| WO | 2019/217749 A1 | 11/2019 |

\* cited by examiner

*Primary Examiner* — Daborah Chacko-Davis
(74) *Attorney, Agent, or Firm* — STUDEBAKER BRACKETT PLLC

(57) ABSTRACT

A method of manufacturing a semiconductor device includes forming a dopant layer including a dopant composition over a substrate. A resist layer including a resist composition is formed over the dopant layer. A dopant is diffused from the dopant composition in the dopant layer into the resist layer; and a pattern is formed in the resist layer.

20 Claims, 30 Drawing Sheets

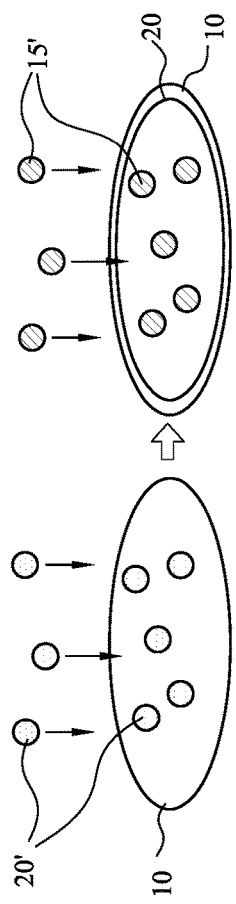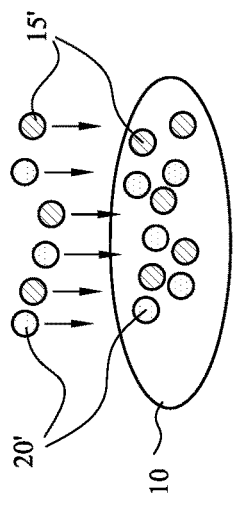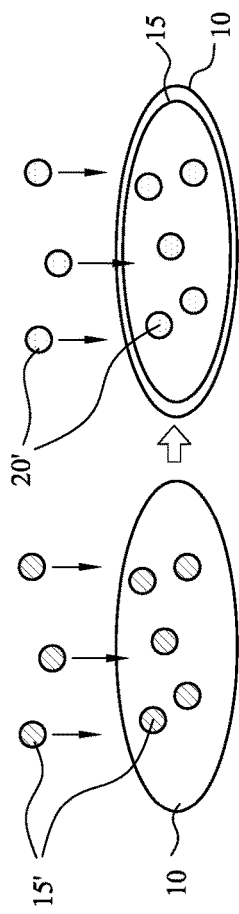

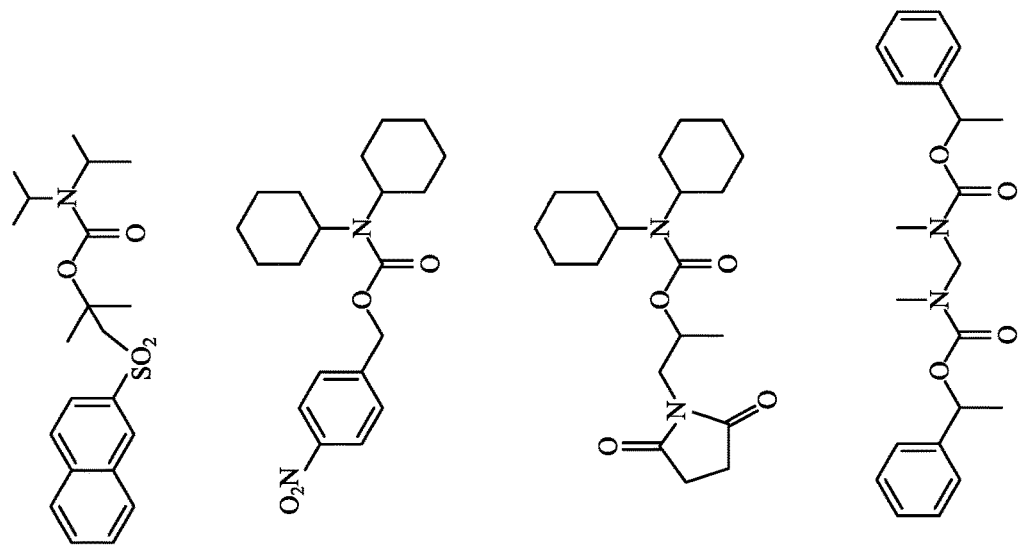
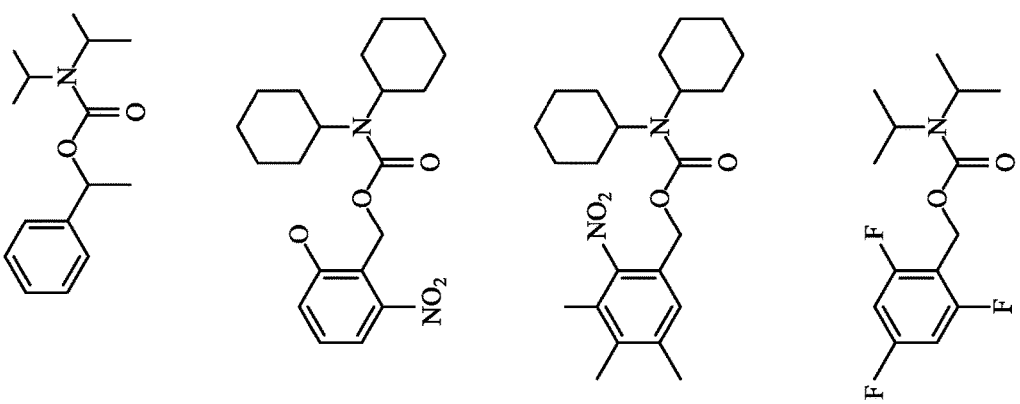
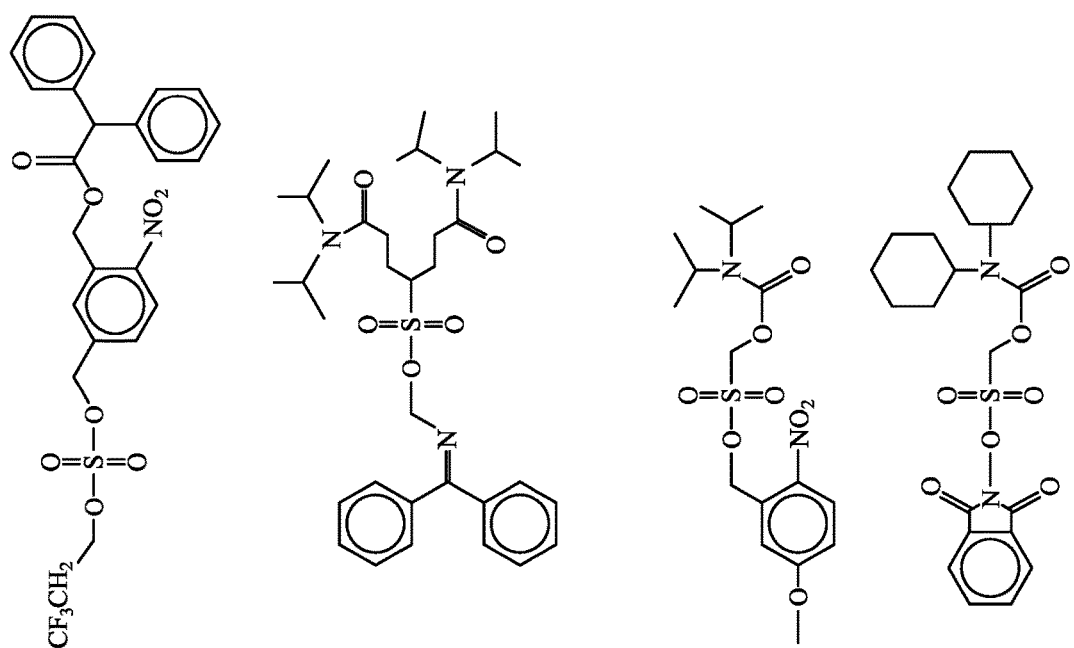
FIG. 16

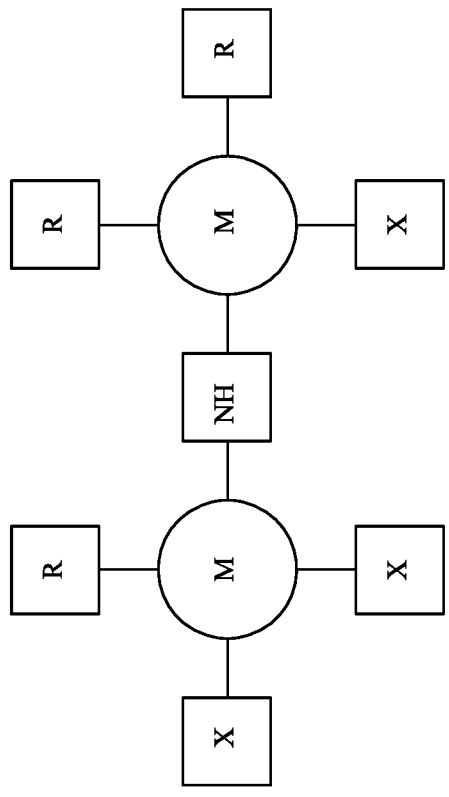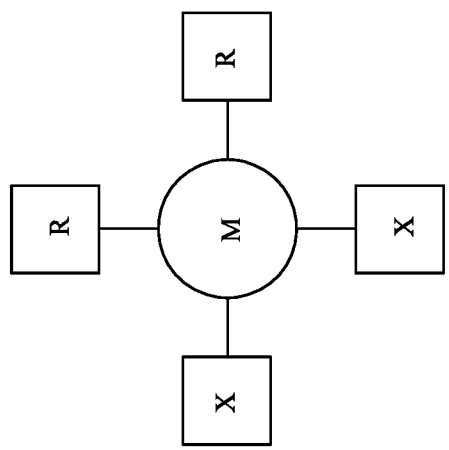
FIG. 22A

METHOD OF MANUFACTURING A SEMICONDUCTOR DEVICE

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface of a layer to be patterned and then exposed to an energy that has itself been patterned. Such an exposure modifies the chemical and physical properties of the exposed regions of the photosensitive material. This modification, along with the lack of modification in regions of the photosensitive material that were not exposed, can be exploited to remove one region without removing the other, or vice-versa.

However, as the size of individual devices has decreased, process windows for photolithographic processing has become tighter and tighter. As such, advances in the field of photolithographic processing are necessary to maintain the ability to scale down the devices, and further improvements are needed in order to meet the desired design criteria such that the march towards smaller and smaller components may be maintained.

As the semiconductor industry has progressed into nanometer technology process nodes in pursuit of higher device density, higher performance, and lower costs, there have been challenges in reducing semiconductor feature size.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 11A and 11B show process stages of a sequential operation according to an embodiment of the disclosure.

FIG. 12 shows a process stage of a sequential operation according to an embodiment of the disclosure.

FIGS. 13A and 13B show process stages of a sequential operation according to an embodiment of the disclosure.

FIG. 16 illustrates examples of photobase generators according to embodiments of the disclosure.

FIG. 22A shows organometallic precursors according to embodiments of the disclosure.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Extreme ultraviolet lithography has been developed for use in nanometer technology process nodes, such as below 40 nm process nodes. C, N, O atoms in the polymers of organic photoresists are weak in EUV photon absorption. It has been found that certain metals have higher EUV photon absorption. To use the higher EUV photon absorption of metals, metallic resist have been developed. However, it is desirable to improve metallic resist lithographic performance by improving the line width roughness (LWR) of the resist pattern, the peeling properties of the resist, and reducing the number of defects. It is desirable to reduce LWR to less than 5.0 nm, and to reduce the exposure dose of the photoresist to less than 70 mj. In some embodiments, the lithographic properties of metallic resists are improved by doping the metallic resist with a dopant. In some embodiments, the dopant is one or more selected from the group consisting of a photoacid generator, a quencher, a photobase generator, an organic acid, an inorganic acid, an organic base, an inorganic base, a crosslinker, a surfactant, a solvent having a boiling point greater than 100° C., water, or a chelate.

Figure 1A:
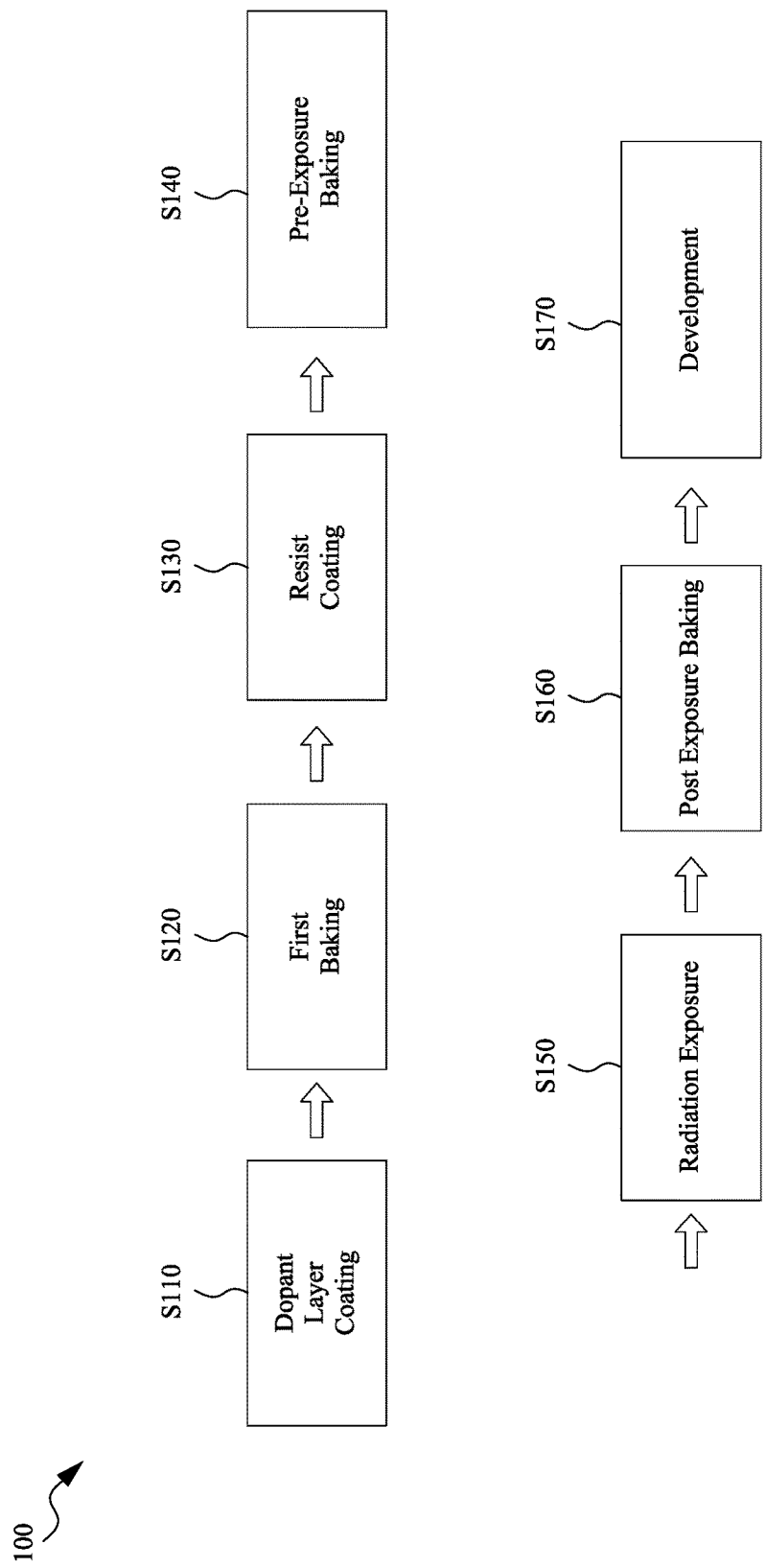
FIGS. 1A and 1B illustrate process flows of manufacturing a semiconductor device according to embodiments of the disclosure.
Figure 2B:
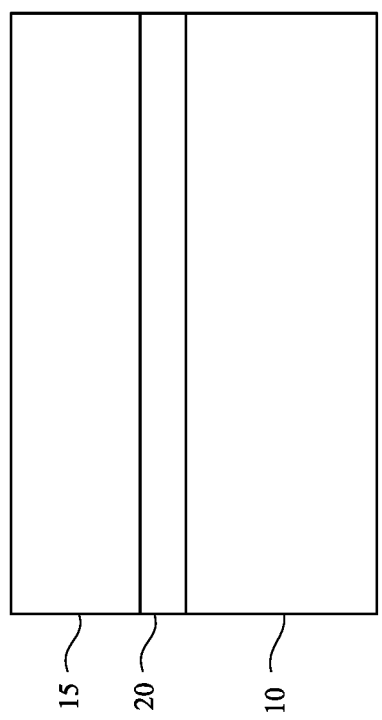
FIGS. 2A and 2B show process stages of a sequential operation according to embodiments of the disclosure.
Figure 2A:
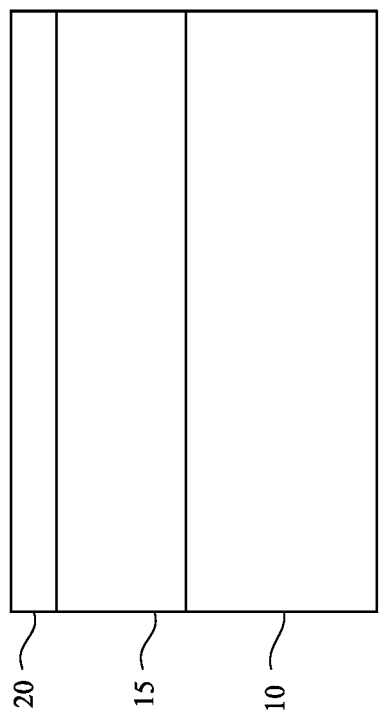

FIG. 1A illustrates a process flow 100 of manufacturing a semiconductor device according to embodiments of the disclosure. A dopant layer 20 is coated on a surface of a target layer 60 to be patterned or a substrate 10 in operation S110, as shown in FIG. 2A. The dopant layer 20 includes a dopant composition including a dopant. In some embodiments, a first baking operation is performed in operation S120 to drive off solvents in the dopant layer composition. In some embodiments, the dopant layer 20 is heated at a temperature of ranging from about 40° C. to about 120° C. for about 10 seconds to about 10 minutes.

Figure 3A:
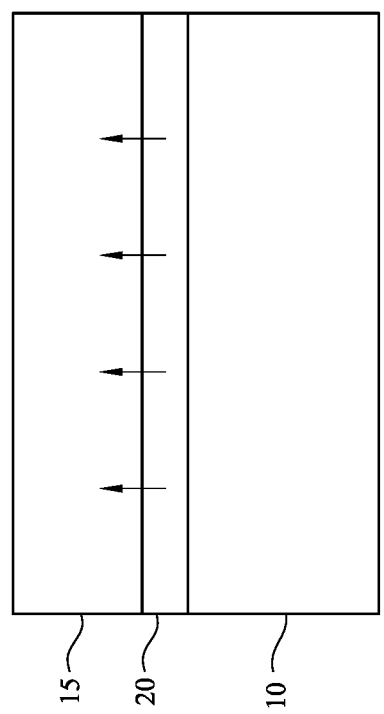
FIGS. 3A and 3B show process stages of a sequential operation according to embodiments of the disclosure.
Figure 4:
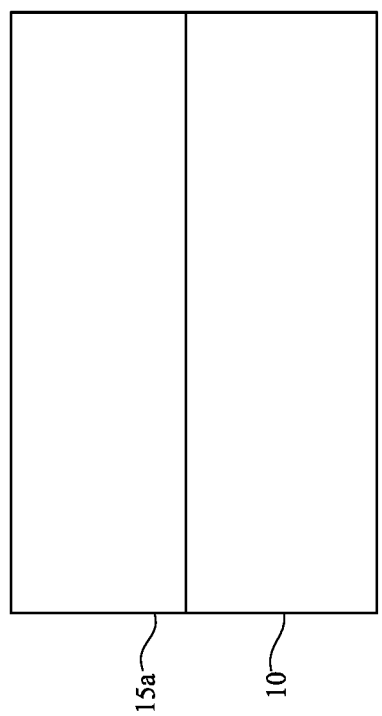
FIG. 4 shows a process stage of a sequential operation according to an embodiment of the disclosure.

A resist composition is coated on a surface of dopant layer 20 in operation S130, in some embodiments, to form a resist layer 15, as shown in FIG. 2A. In some embodiments, the resist layer is a photoresist layer. In some embodiments, the resist composition is a metallic resist composition and the resist layer 15 is a metallic resist layer. In some embodiments, the metallic resist composition includes one or more organometallic compounds. Then the resist layer 15 undergoes a second (or pre-exposure) baking operation S140 to diffuse dopants in the dopant layer 20, as shown in FIG. 3A in some embodiments, to form a doped resist layer 15a, as shown in FIG. 4. In some embodiments, the dopant layer 20 and the resist layer 15 are heated at a temperature ranging from about 40° C. to about 250° C. to diffuse the dopant throughout resist layer 15. In some embodiments, the dopant is uniformly distributed throughout the doped resist layer 15a.

Figure 1B:
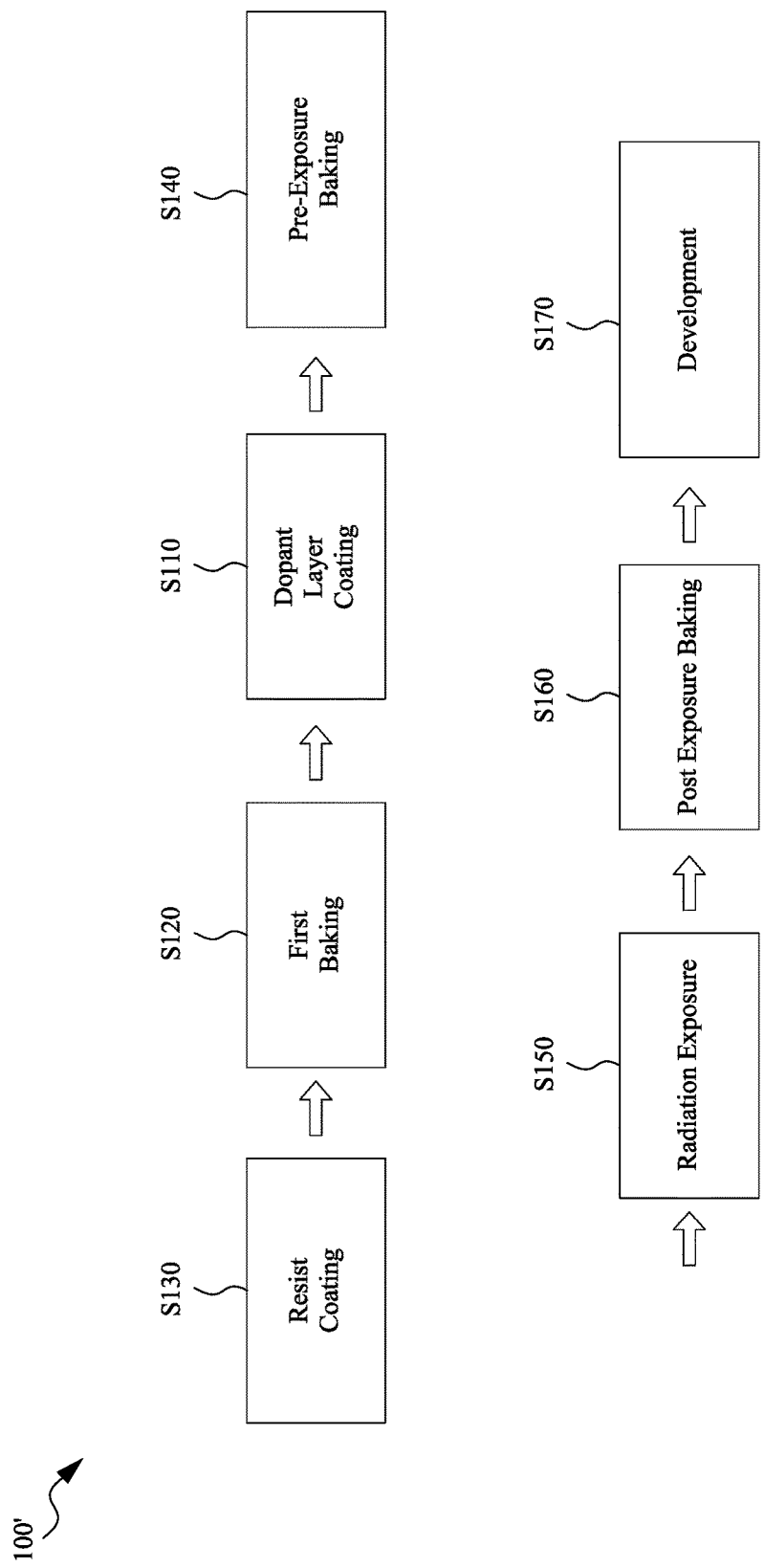

FIG. 1B illustrates a process flow 100' of manufacturing a semiconductor device according to embodiments of the disclosure. A resist composition is coated on a surface of a target layer 60 to be patterned or a substrate 10 in operation S130, as shown in FIG. 2B, to form a resist layer 15. In some embodiments, the resist layer 15 is a photoresist layer. In some embodiments, the resist composition is a metallic resist composition and the resist layer 15 is a metallic resist layer. In some embodiments, the metallic resist composition includes one or more organometallic compounds. In some embodiments, a first baking of the resist layer 15 is performed in operation S120. In some embodiments, the resist layer is heated at a temperature of ranging from about 40° C. to about 120° C. for about 10 seconds to about 10 minutes to cure the resist layer or to drive off solvents.

Figure 3B:
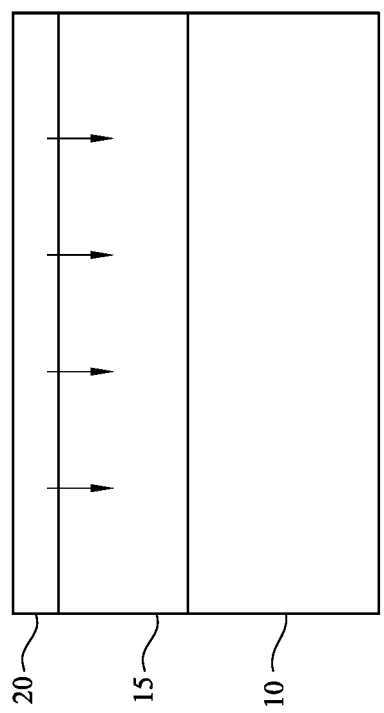

A dopant layer 20 is formed on a surface of resist layer 15 in operation S130, in some embodiments, as shown in FIG. 2B. The dopant layer 20 includes a dopant composition including a dopant. Then the dopant layer 20 and the resist layer 15 undergoes a second (or pre-exposure) baking operation S140 to diffuse dopants in the dopant layer 20, as shown in FIG. 3B in some embodiments, to form a doped resist layer 15a, as shown in FIG. 4. In some embodiments, the dopant layer 20 and the resist layer 15 are heated at a temperature ranging from about 40° C. to about 250° C. to diffuse the dopant throughout resist layer 15. In some embodiments, the dopant is uniformly distributed throughout the doped resist layer 15a. In some embodiments, the dopant in the dopant layer 20 is not completely distributed in the resist layer. Thus, a portion of the dopant layer 20 remains after the pre-exposure baking operation S140 in some embodiments. In some embodiments, the pre-exposure bake also drives off solvents in the dopant layer 20.

After the pre-exposure baking operation S140 of the photoresist layer 15 and dopant layer 20, the doped photoresist layer 15a is selectively exposed to actinic radiation 45/97 (see FIGS. 5A and 5B) in operation S150. In some embodiments, the photoresist layer 15 is selectively exposed to ultraviolet radiation. In some embodiments, the radiation is electromagnetic radiation, such as g-line (wavelength of about 436 nm), i-line (wavelength of about 365 nm), ultraviolet radiation, deep ultraviolet radiation, extreme ultraviolet, electron beams, or the like. In some embodiments, the radiation source is selected from the group consisting of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), or a $CO_2$ laser-excited Sn plasma (extreme ultraviolet, wavelength of 13.5 nm).

Figure 5A:
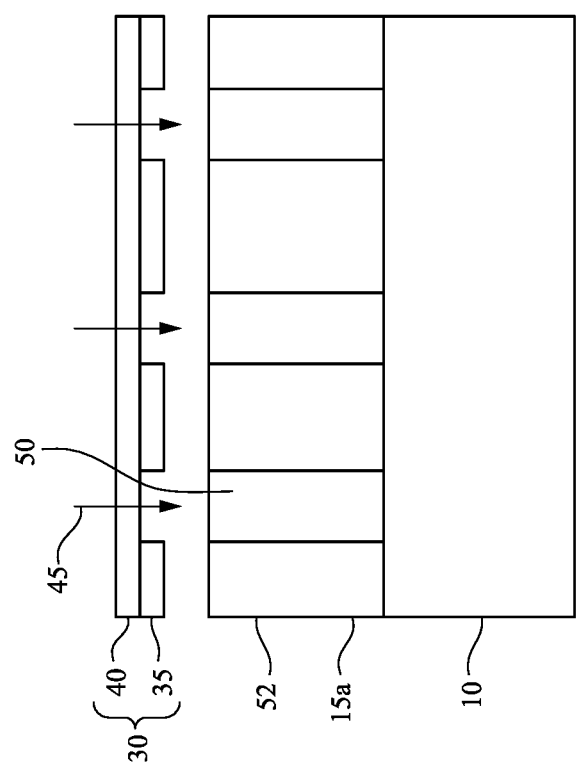
FIGS. 5A and 5B show process stages of a sequential operation according to embodiments of the disclosure.

As shown in FIG. 5A, the exposure radiation 45 passes through a photomask 30 before irradiating the photoresist layer 15 in some embodiments. In some embodiments, the photomask has a pattern to be replicated in the doped photoresist layer 15a. The pattern is formed by an opaque pattern 35 on the photomask substrate 40, in some embodiments. The opaque pattern 35 may be formed by a material opaque to ultraviolet radiation, such as chromium, while the photomask substrate 40 is formed of a material that is transparent to ultraviolet radiation, such as fused quartz.

Figure 5B:
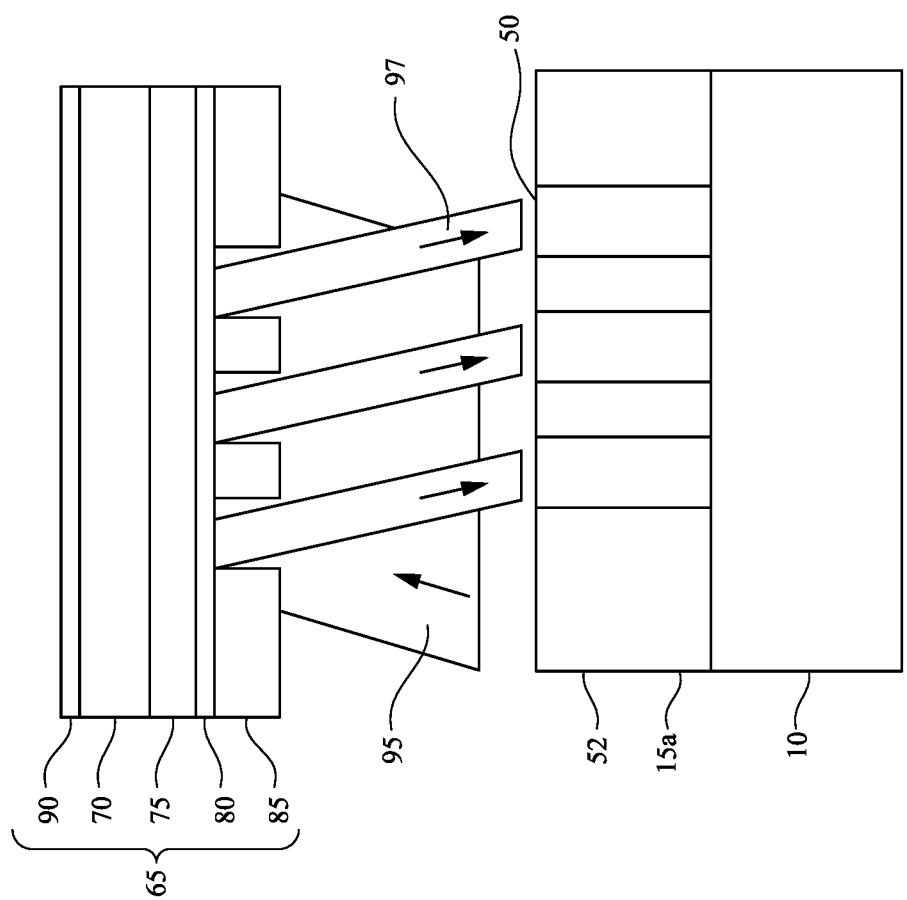

In some embodiments, the selective exposure of the doped photoresist layer 15a to form exposed regions 50 and unexposed regions 52 is performed using extreme ultraviolet lithography. In an extreme ultraviolet lithography operation a reflective photomask 65 is used to form the patterned exposure light in some embodiments, as shown in FIG. 5B. The reflective photomask 65 includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the back side of the low thermal expansion glass substrate 70. In extreme ultraviolet lithography, extreme ultraviolet radiation 95 is directed towards the reflective photomask 65 at an incident angle of about 6°. A portion 97 of the extreme ultraviolet radiation is reflected by the Si/Mo multilayer 75 towards the photoresist coated substrate 10, while the portion of the extreme ultraviolet radiation incident upon the absorber layer 85 is absorbed by the photomask. In some embodiments, additional optics, including mirrors, are between the reflective photomask 65 and the photoresist coated substrate.

The region of the doped photoresist layer exposed to radiation 50 undergoes a chemical reaction thereby changing its solubility in a subsequently applied developer relative to the region of the doped photoresist layer not exposed to radiation 52. In some embodiments, the portion of the doped photoresist layer exposed to radiation 50 undergoes a crosslinking reaction.

Next, the doped photoresist layer 15*a* undergoes a third baking (or post-exposure bake (PEB)) in operation S160. In some embodiments, the doped photoresist layer 15*a* is heated at a temperature ranging from about 50° C. to about 160° C. for about 20 seconds to about 120 seconds. The post-exposure baking may be used to assist in the generating, dispersing, and reacting of the acid/base/free radical generated from the impingement of the radiation 45/97 upon the doped photoresist layer 15*a* during the exposure. Such assistance helps to create or enhance chemical reactions, which generate chemical differences between the exposed region 50 and the unexposed region 52 within the photoresist layer.

Figure 6:
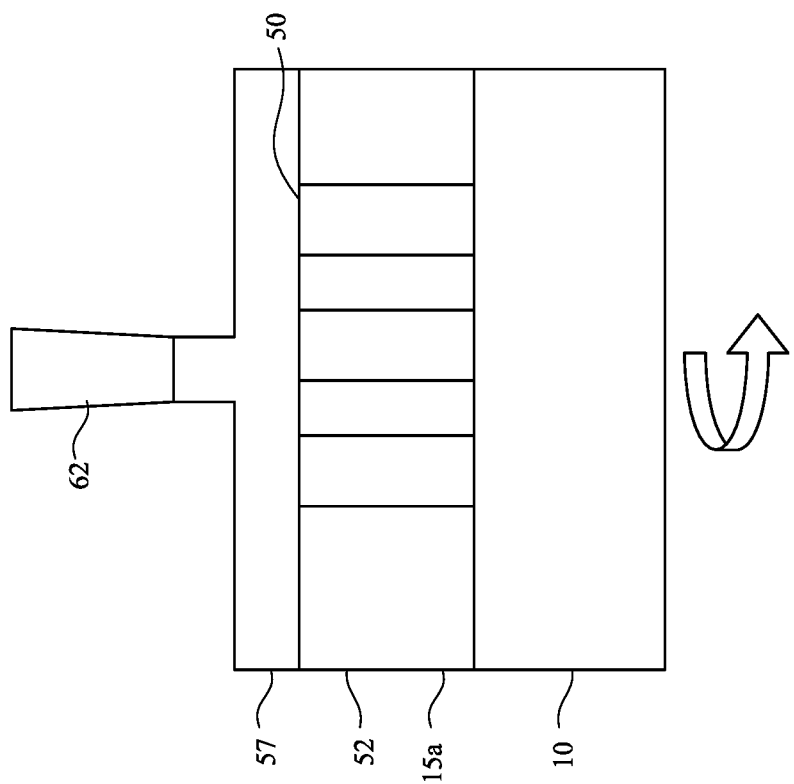
FIG. 6 shows a process stage of a sequential operation according to an embodiment of the disclosure.
Figure 7:
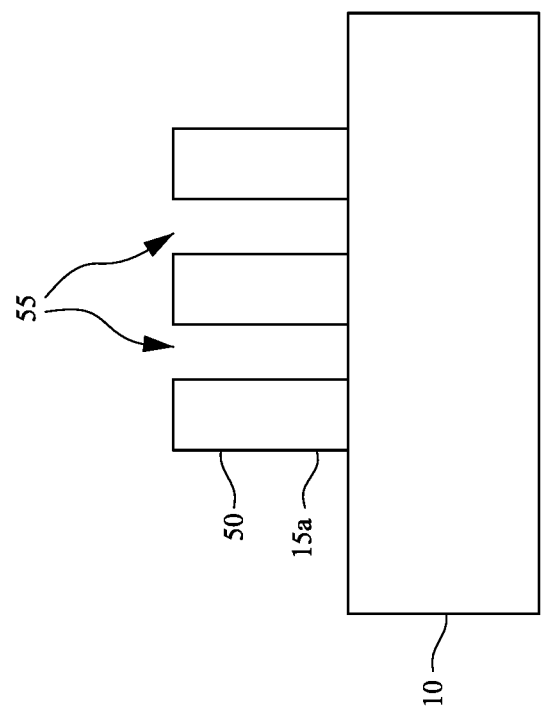
FIG. 7 shows a process stage of a sequential operation according to an embodiment of the disclosure.

The selectively exposed doped photoresist layer is subsequently developed by applying a developer to the selectively exposed doped photoresist layer in operation S170. As shown in FIG. 6, a developer 57 is supplied from a dispenser 62 to the doped photoresist layer 15*a*. In some embodiments, the unexposed region 52 of the photoresist layer is removed by the developer 57 forming a pattern of openings 55 in the doped photoresist layer 15*a* to expose the substrate 10, as shown in FIG. 7.

Figure 8:
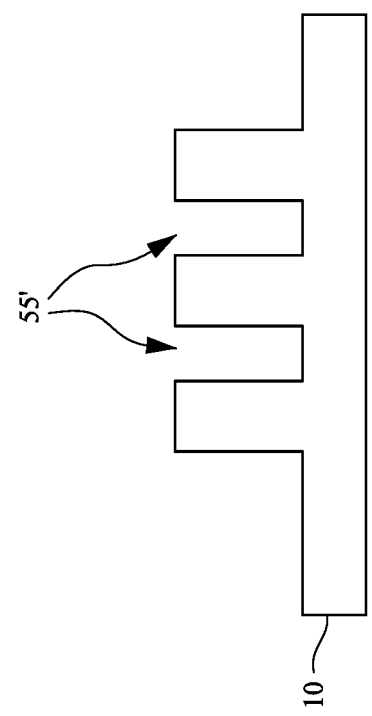
FIG. 8 shows a process stage of a sequential operation according to an embodiment of the disclosure.

In some embodiments, the pattern of openings 55 in the doped photoresist layer 15*a* is extended into the substrate 10 to create a pattern of openings 55' in the substrate 10, thereby transferring the pattern in the doped photoresist layer 15*a* into the substrate 10, as shown in FIG. 8. The pattern is extended into the substrate by etching, using one or more suitable etchants. In some embodiments, the etching operation removes portions of the dopant layer still remaining if the dopant is not completely diffused into the resist layer. The photoresist layer pattern 50 is at least partially removed during the etching operation in some embodiments. In other embodiments, the photoresist layer pattern 50 and any remaining portions of the dopant layer 20 under the photoresist layer pattern 55 are removed after etching the substrate 10 by using a suitable photoresist stripper solvent or by a photoresist ashing operation.

In some embodiments, the substrate 10 includes a single crystalline semiconductor layer on at least it surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 10 is a silicon layer of an SOI (silicon-on insulator) substrate. In certain embodiments, the substrate 10 is made of crystalline Si.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

In some embodiments, the substrate 10 includes one or more layers of at least one metal, metal alloy, and metal nitride sulfide/oxide/silicide having the formula $MX_a$, where M is a metal and X is N, S, Se, O, Si, and a is from about 0.4 to about 2.5. In some embodiments, the substrate 10 includes titanium, aluminum, cobalt, ruthenium, titanium nitride, tungsten nitride, tantalum nitride, and combinations thereof.

In some embodiments, the substrate 10 includes a dielectric having at least a silicon or metal oxide or nitride of the formula $MX_b$, where M is a metal or Si, X is N or O, and b ranges from about 0.4 to about 2.5. In some embodiments, the substrate 10 includes silicon dioxide, silicon nitride, aluminum oxide, hafnium oxide, lanthanum oxide, and combinations thereof.

Figure 9A:
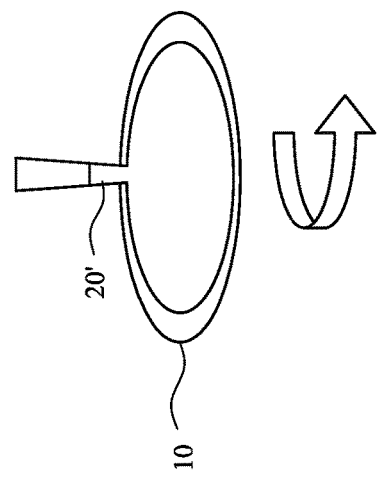
FIGS. 9A and 9B show process stages of a sequential operation according to an embodiment of the disclosure.
Figure 9B:
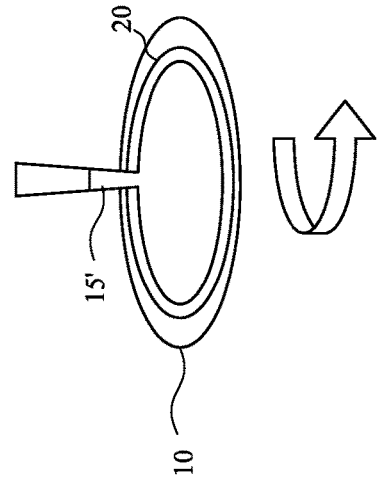

In some embodiments, a dopant composition 20' is applied to the surface of a substrate 10 as a liquid. In some embodiments, the dopant is mixed with a solvent and then applied to the surface of the substrate. In other embodiments, the dopant is a liquid. In some embodiments, the dopant composition 20' is applied by spin coating on the dopant composition 20' as shown in FIG. 9A. A resist composition 15' is subsequently applied to the surface of the dopant layer 20 as a liquid. In some embodiments, the resist composition 15' is spin coated over the dopant layer 20, as shown in FIG. 9B. In some embodiments, the spin coated dopant layer 20 is baked at a temperature ranging from about 40° C. to about 120° C. for about 10 seconds to about 10 minutes before the resist composition 15' is applied to the surface of the dopant layer 20. In other embodiments, the resist composition 15' is applied to the surface of the dopant layer 20 before heating the dopant layer, and the resist layer 15 and the dopant layer 20 are heated together at a temperature ranging from about 40° C. to about 250° C. for about 10 seconds to about 10 minutes to diffuse the dopant into the resist layer 15 and cure and dry the resist layer 15.

Figure 10A:
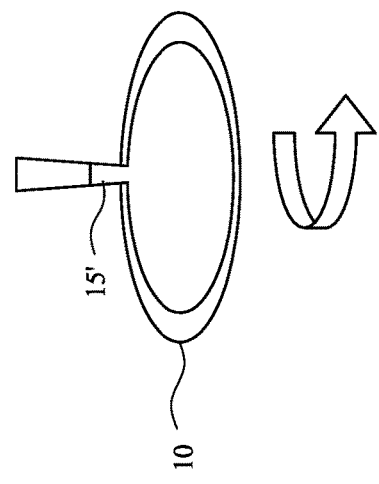
FIGS. 10A and 10B show process stages of a sequential operation according to an embodiment of the disclosure.
Figure 10B:
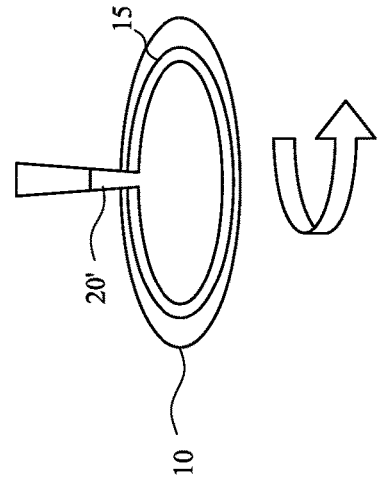

In some embodiments, the resist composition 15' is applied to the surface of a substrate 10 as a liquid. In some embodiments, the resist composition 15' is applied by spin coating on the substrate 10, as shown in FIG. 10A. The dopant composition 20' is subsequently applied to the surface of the resist layer 15 as a liquid. In some embodiments, the dopant is mixed with a solvent and then applied to the surface of the resist layer. In other embodiments, the dopant is a liquid. In some embodiments, the dopant composition 20' is spin coated over the resist layer 15, as shown in FIG. 10B. In some embodiments, the spin coated resist layer 15 is baked at a temperature ranging from about 40° C. to about 120° C. for about 10 seconds to about 10 minutes before the dopant composition 20' is applied to the surface of the resist layer 15. In other embodiments, the dopant composition 20' is applied to the surface of the resist layer 15 before heating the resist layer, and the resist layer 15 and the dopant layer 20 are heated together at a temperature ranging from about 40° C. to about 250° C. for about 10 seconds to about 10 minutes to diffuse the dopant into the resist layer 15 and cure and dry the resist layer 15.

In some embodiments, the dopant composition 20' is applied to the surface of a substrate 10 by a vapor phase deposition technique, as shown in FIG. 11A. A resist composition 15' is subsequently applied to the surface of the dopant layer 20 by a vapor phase deposition technique, as shown in FIG. 11B. In some embodiments, the vapor deposition technique is selected from the group consisting of chemical vapor deposition (CVD), physical vapor deposition (PVD), and atomic layer deposition (ALD). In some embodiments, the dopant layer 20 is baked at a temperature ranging from about 40° C. to about 120° C. for about 10 seconds to about 10 minutes before the resist composition 15' is applied to the surface of the dopant layer 20. In other embodiments, the resist composition 15' is applied to the surface of the dopant layer 20 before heating the dopant layer, and the resist layer 15 and the dopant layer 20 are heated together at a temperature ranging from about 40° C. to about 250° C. for about 10 seconds to about 10 minutes to diffuse the dopant into the resist layer 15.

In some embodiments, the dopant composition 20' and the resist composition 15' are deposited at substantially the same time using a vapor phase deposition technique, as shown in FIG. 12. In such a case, a separate diffusion operation is not performed in some embodiments.

In some embodiments, the resist composition 15' is applied to the surface of a substrate 10 by a vapor phase deposition technique, as shown in FIG. 13A. A dopant composition 20' is subsequently applied to the surface of the resist layer 15 by a vapor phase deposition technique, such as CVD, PVD, or ALD, as shown in FIG. 13B. In some embodiments, the resist layer 15 is baked at a temperature ranging from about 40° C. to about 120° C. for about 10 seconds to about 10 minutes before the dopant composition 20' is applied to the surface of the resist layer 15. In other embodiments, the dopant composition 20' is applied to the surface of the resist layer 15 before heating the resist layer, and the resist layer 15 and the dopant layer 20 are heated together at a temperature ranging from about 40° C. to about 250° C. for about 10 seconds to about 10 minutes to diffuse the dopant into the resist layer 15.

In some embodiments, a combination of liquid deposition and vapor phase deposition techniques are used to form the dopant layer 20 and the resist layer 15. For example, in some embodiments, the dopant layer 20 is formed by a spin coating technique and then the resist layer 15 is formed by a vapor phase deposition technique. In other embodiments, the dopant layer 20 is formed by a vapor phase deposition technique and then the resist layer 15 is formed by a spin coating technique. In other embodiments, the resist layer 15 is formed by a spin coating technique and then the dopant layer 20 is formed vapor phase deposition technique. In other embodiments, the resist layer 15 is formed by a vapor phase deposition technique and then the dopant layer 20 is formed by a spin coating technique.

The dopant composition includes the dopant composition comprises one or more of a photoacid generator, a quencher, a photobase generator, an organic acid, an inorganic acid, an organic base, an inorganic base, a crosslinker, a surfactant, a solvent having a boiling point greater than 100° C., water, or a chelate. In some embodiments, the dopant is mixed with a solvent and then applied to the surface of the substrate 10 or the resist layer 15.

Figure 14:
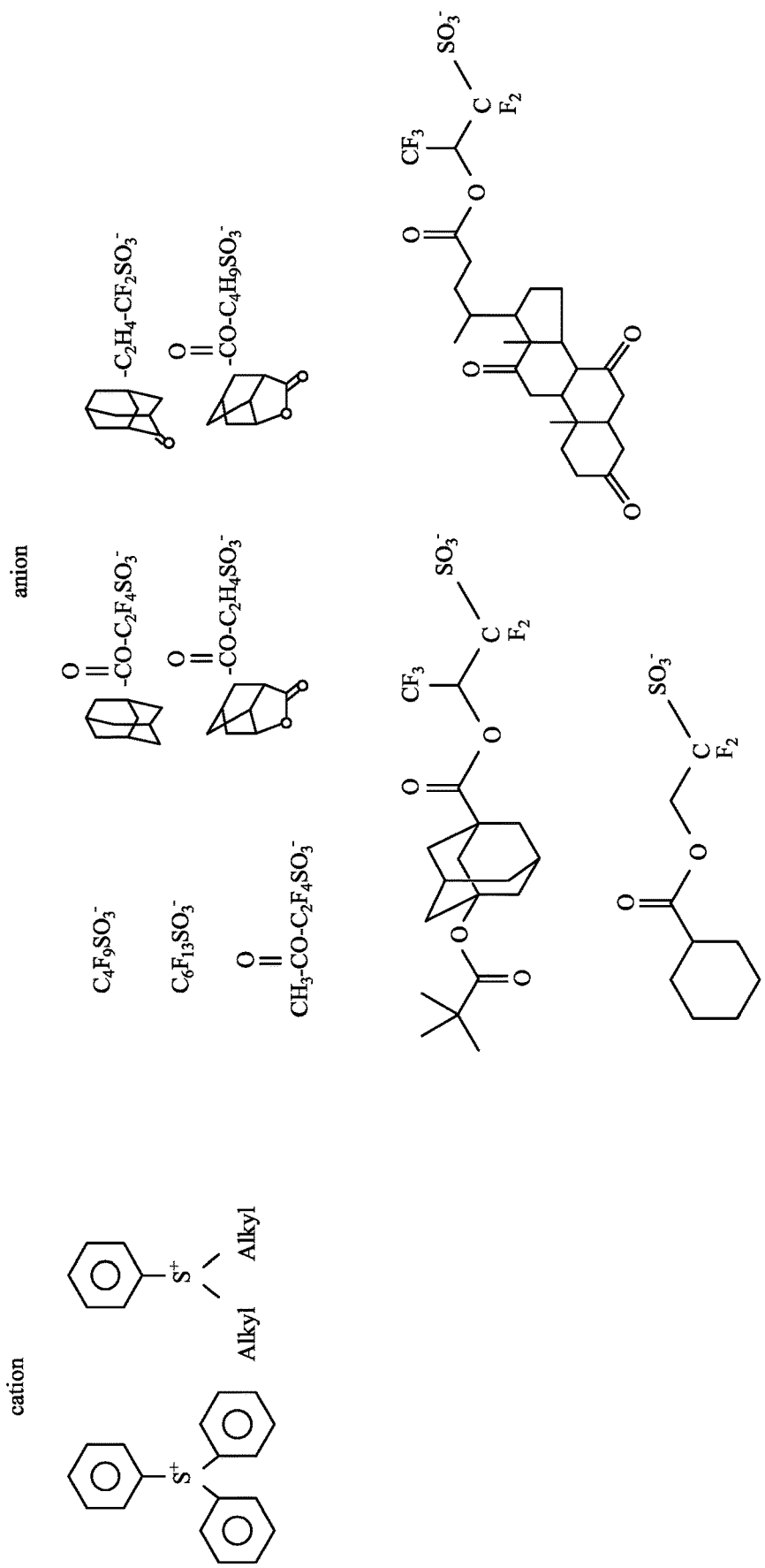
FIG. 14 illustrates examples of photoacid generators according to embodiments of the disclosure.

FIG. 14 illustrates examples of photoacid generators (PAGs) according to embodiments of the disclosure. The photoacid generators illustrated in FIG. 14 are compounds including a cation and an anion. In some embodiments, the PAGs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, combinations of these, or the like.

Some specific examples of photoacid generators include α-(trifluoromethylsulfonyloxy)-bicyclo[2.2.1]hept-5-ene-2, 3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates and hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl)sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

In some embodiments, the PAG is mixed with a solvent and then the mixture is applied to the surface of the substrate 10 or the resist layer 15. When the PAG doped photoresist layer 15a is exposed to actinic radiation, the PAG absorbs the radiation and generates an acid. The generated acid assists the photochemical reaction occurring in the doped photoresist layer. In some embodiments, a concentration of the PAG in the doped photoresist layer ranges from about 0.1 wt. % to about 20 wt. % based on the weight of the PAG and the resist composition. At PAG concentrations below the disclosed range there may not be a sufficient amount of the PAG to provide a measurable improvement in the resist parameters or performance. At PAG concentrations above the disclosed range there may not be a significant additional improvement in the resist parameters or performance.

Metallic resists used in EUV and e-beam applications typically do not include photoacid generators (PAGs). In the present disclosure, PAGs are introduced into resist layer 15 to provide improved pattern resolution and improved line width roughness (LWR). The inclusion of PAGs in the resist layer 15 enable the use of lower exposure doses during the photoresist exposure operation and provide increased yield of semiconductor devices.

Figure 15:
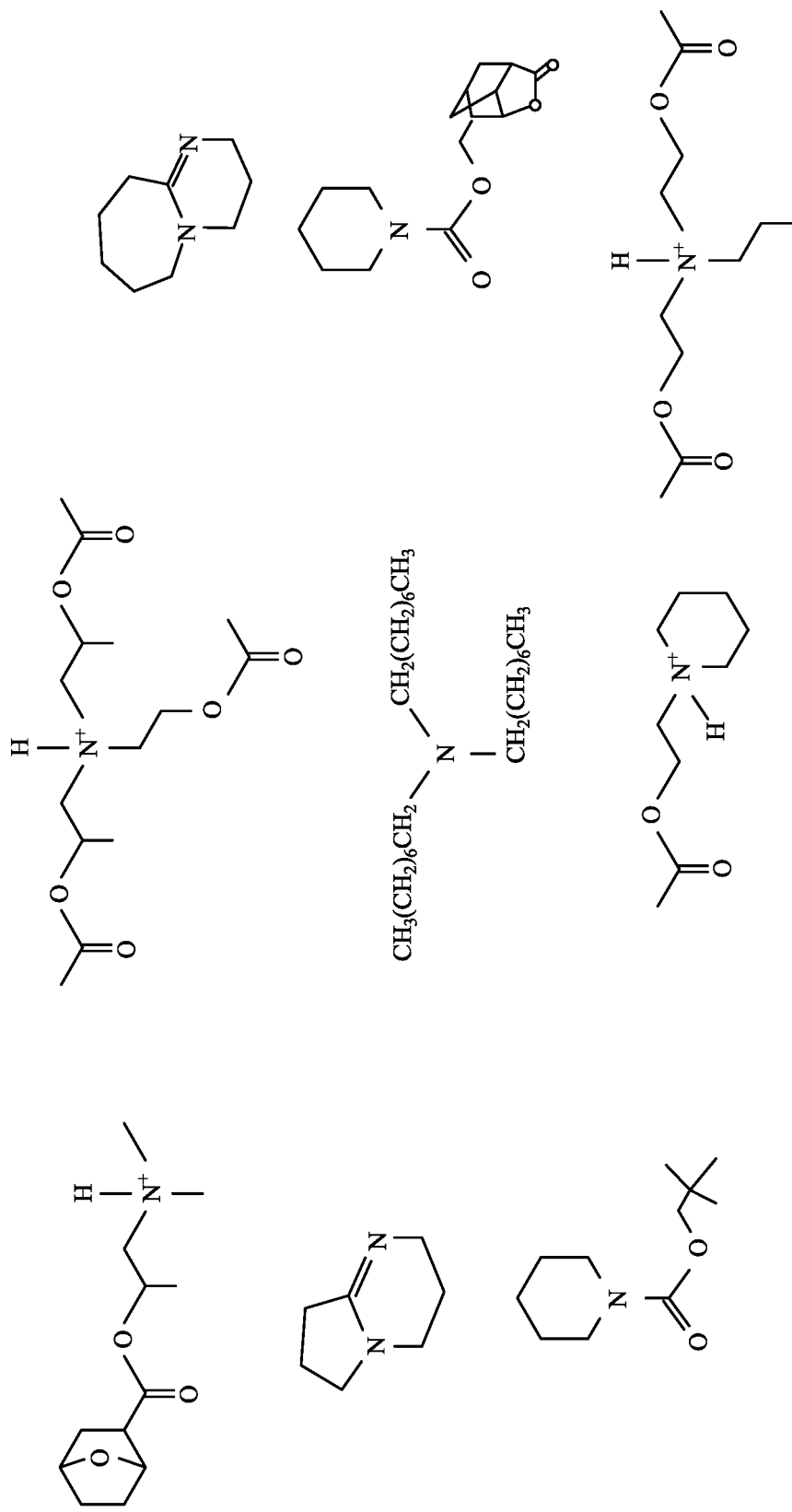
FIG. 15 illustrates examples of quenchers according to embodiments of the disclosure.

In some embodiments, the dopant is a quencher. In some embodiments, the quencher is an amine, such as a second lower aliphatic amine, a tertiary lower aliphatic amine, or the like. Specific examples of amines include trimethylamine, diethylamine, triethylamine, di-n-propylamine, tri-n-propylamine, tripentylamine, diethanolamine, and triethanolamine, alkanolamine, combinations thereof, or the like. FIG. 15 illustrates examples of quenchers according to embodiments of the disclosure.

In some embodiments, the quencher is mixed with a solvent and then the mixture is applied to the surface of the substrate 10 or the resist layer 15. In some embodiments, an amount of the quencher in the doped photoresist layer ranges from about 0.1 wt. % to about 20 wt. % based on the weight of the quencher and the resist composition. At quencher concentrations below the disclosed range there may not be a sufficient amount of the quencher to provide a measurable improvement in the resist parameters or performance. At quencher concentrations above the disclosed range there may not be a significant additional improvement in the resist parameters or performance.

In some embodiments, the dopant is a photobase generator (PBG). In some embodiments, the PBG is a quaternary ammonium dithiocarbamate, an a aminoketones, an oximeurethane containing molecule such as dibenzophenonoeoxime hexamethylene diurethan, ammonium tetraorganylborate salts, and N-(2-nitrobenzyloxycarbonyl)cyclic amines. FIG. 16 illustrates examples of photobase generators according to embodiments of the disclosure.

In some embodiments, the PBG is mixed with a solvent and then the mixture is applied to the surface of the substrate 10 or the resist layer 15. In some embodiments, a concentration of the PBG in the doped photoresist layer ranges from about 0.1 wt. % to about 20 wt. % based on the weight of the PBG and the resist composition. At PBG concentrations below the disclosed range there may not be a sufficient amount of the PBG to provide a measurable improvement in the resist parameters or performance. At PBG concentrations above the disclosed range there may not be a significant additional improvement in the resist parameters or performance.

Metallic resists used in EUV and e-beam applications typically do not include a quencher or a PBG. In the present disclosure, a quencher or a PBG is introduced into resist layer 15 to provide improved pattern resolution and improved line width roughness (LWR). The inclusion of a quencher or a PBG in the resist layer 15 enable the use of lower exposure doses during the photoresist exposure operation and provide increased yield of semiconductor devices.

Figure 17:
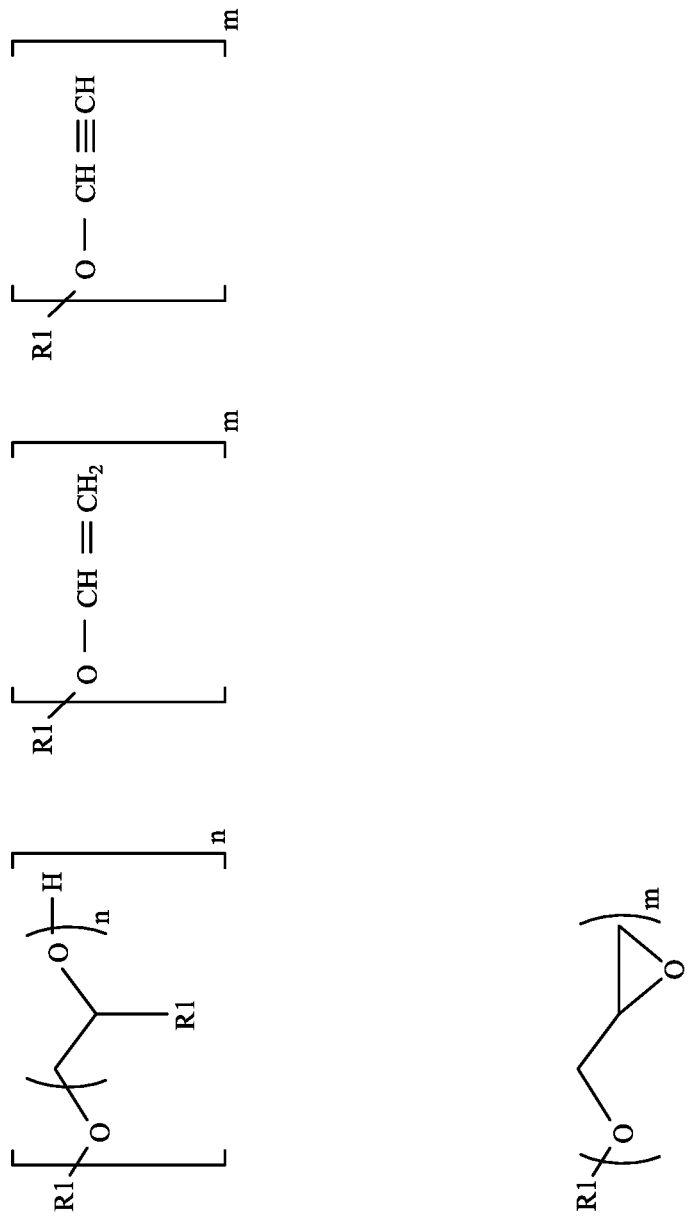
FIG. 17 illustrates examples of crosslinkers according to embodiments of the disclosure.

FIG. 17 illustrates examples of crosslinkers according to embodiments of the disclosure. R1 in the examples of FIG. 17 is a polymer or a C1-C20 hydrocarbon group. In some embodiments, the C1-C20 hydrocarbon group is an aliphatic or aromatic group. In some embodiments, the C1-C20 hydrocarbon group is aryl, alkyl, or alkenyl group. In some embodiments, the C1-C20 is substituted with one or more of a halogen, a carbonyl group, a hydroxyl group, a carboxyl group, and an ester group, a chalcogen, a thionyl group, or a thiol group. In FIG. 17, m and n range from 1 to 6. In some embodiments, the crosslinker is activated by heating the doped photoresist layer at temperature ranging from about 20° C. (room temperature) to about 300° C. In some embodiments, an amount of the crosslinker in the doped photoresist layer ranges from about 0.1 wt. % to about 20 wt. % based on the weight of the crosslinker and the resist composition. At crosslinker concentrations below the disclosed range there may not be a sufficient amount of the crosslinker to provide a measurable improvement in the resist parameters or performance. At crosslinker concentrations above the disclosed range there may not be a significant additional improvement in the resist parameters or performance.

Figure 18:
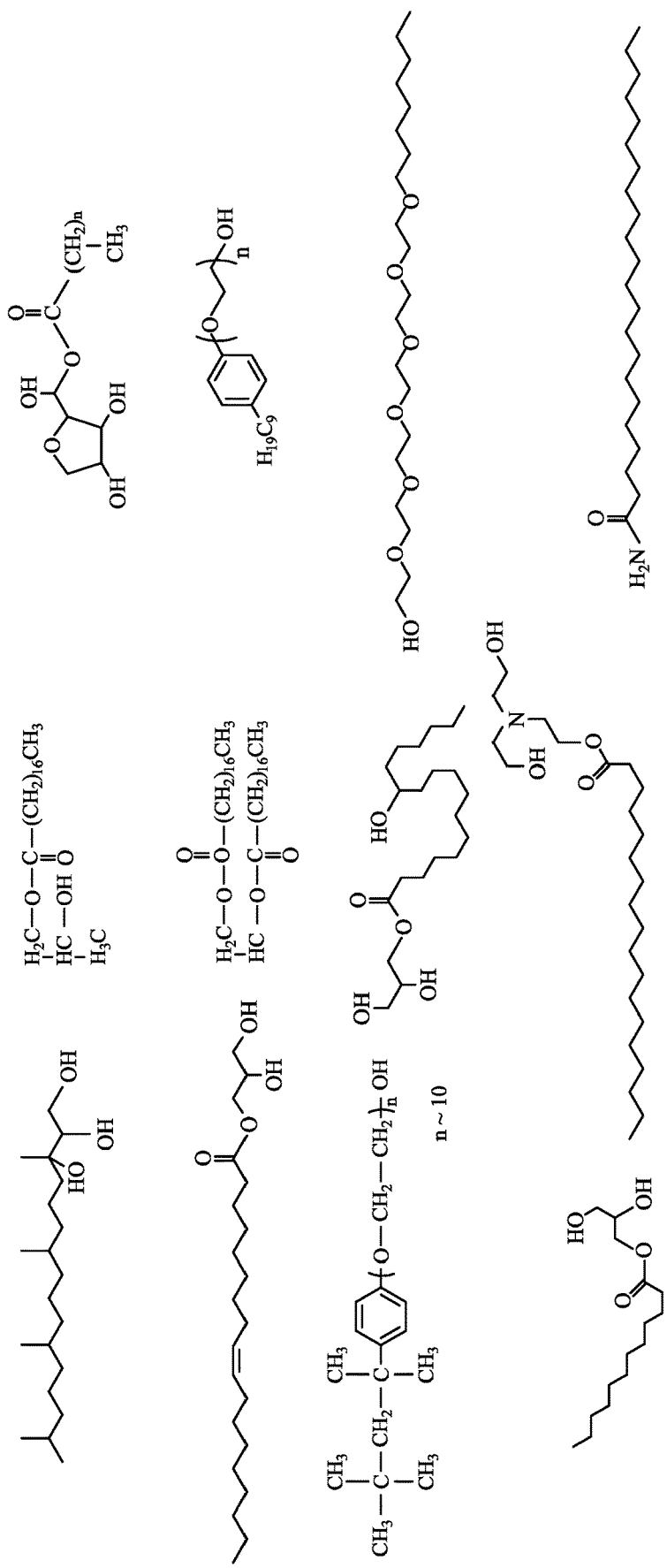
FIG. 18 illustrates examples of non-ionic surfactants according to embodiments of the disclosure.
Figure 19:
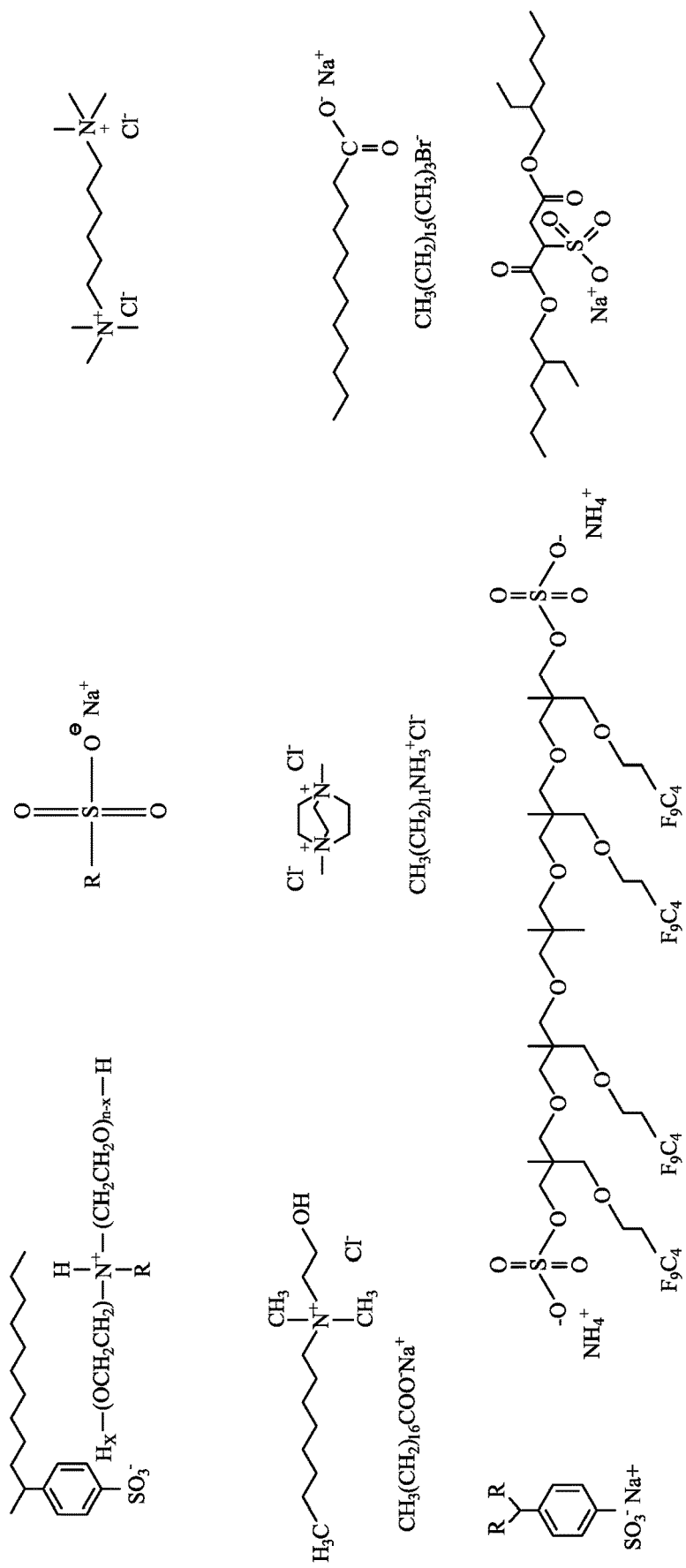
FIG. 19 illustrates examples of ionic surfactants according to embodiments of the disclosure.

In some embodiments, the dopant composition includes a surfactant. FIG. 18 illustrates examples of non-ionic surfactants according to embodiments of the disclosure. In some embodiments, the non-ionic surfactants have a structure of A-X or A-X-A-X, where A is an aliphatic or aromatic, unbranched or branched, cyclic or non-cyclic C2-C100 carbon group. The C2-C100 group may an alkyl group, an alkenyl group, a phenyl group, or two or more fused phenyl groups, each of which may be substituted with oxygen or a halogen. X is an alkyl group substituted with one or more polar functional groups selected from the group consisting of —OH, =O, —C(=O)SH, —C(=O)OH, —C(=O)NH, —SO$_2$OH, —SO$_2$SH, —SOH; or is one or more linking groups selected from the group consisting of —SO$_2$—, —CO—, —CN—, —SO—, —CON—, —NH—, —SO$_3$NH—, SO$_2$NH—, —S—, —P—, —P(O$_2$)—, —C(=O)OR—, —O—, and —N—. FIG. 19 illustrates examples of ionic surfactants according to embodiments of the disclosure.

Figure 20:
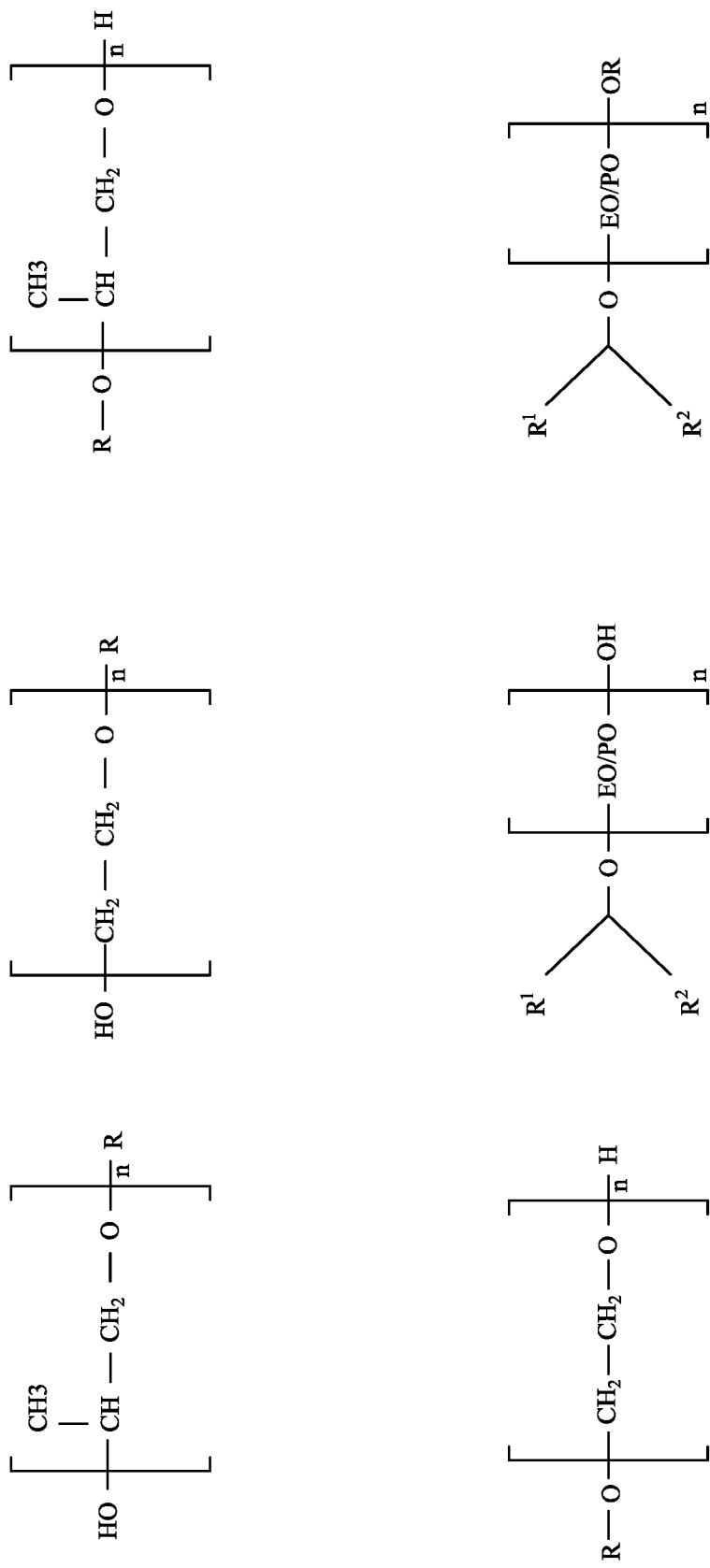
FIG. 20 illustrates examples of EO-PO type surfactants according to embodiments of the disclosure.

FIG. 20 illustrates examples of ethylene oxide (EO)-propylene oxide (PO) type surfactants according to embodiments of the disclosure. In some embodiments, R is a C1-C20 hydrocarbon group. In some embodiments, the C1-C20 hydrocarbon group is an aliphatic or aromatic group. In some embodiments, the C1-C20 hydrocarbon group is aryl, alkyl, or alkenyl group. In some embodiments, the C1-C20 is substituted with one or more of a halogen, a carbonyl group, a hydroxyl group, a carboxyl group, and an ester group, a chalcogen, a thionyl group, or a thiol group. In FIG. 20, n ranges from 1 to 6.

In some embodiments, the chelate is one or more of ethylenediaminetetraacetic acid (EDTA), ethylenediamine-N,N'-disuccinic acid (EDDS), diethyl enetriaminepentaacetic acid (DTPA), polyaspartic acid, trans-1,2-cyclohexanediamine-N,N,N',N'-tetraacetic acid monohydrate, ethylenediamine, or the like.

In some embodiments, a concentration of the surfactant or chelate in the doped photoresist layer ranges from about 0.1 wt. % to about 20 wt. % based on the weight of the surfactant or chelate and the resist composition. At surfactant or chelate concentrations below the disclosed range there may not be a sufficient amount of the crosslinker to provide a measurable improvement in the resist parameters or performance. At surfactant or chelate concentrations above the disclosed range there may not be a significant additional improvement in the resist parameters or performance.

Figure 21:
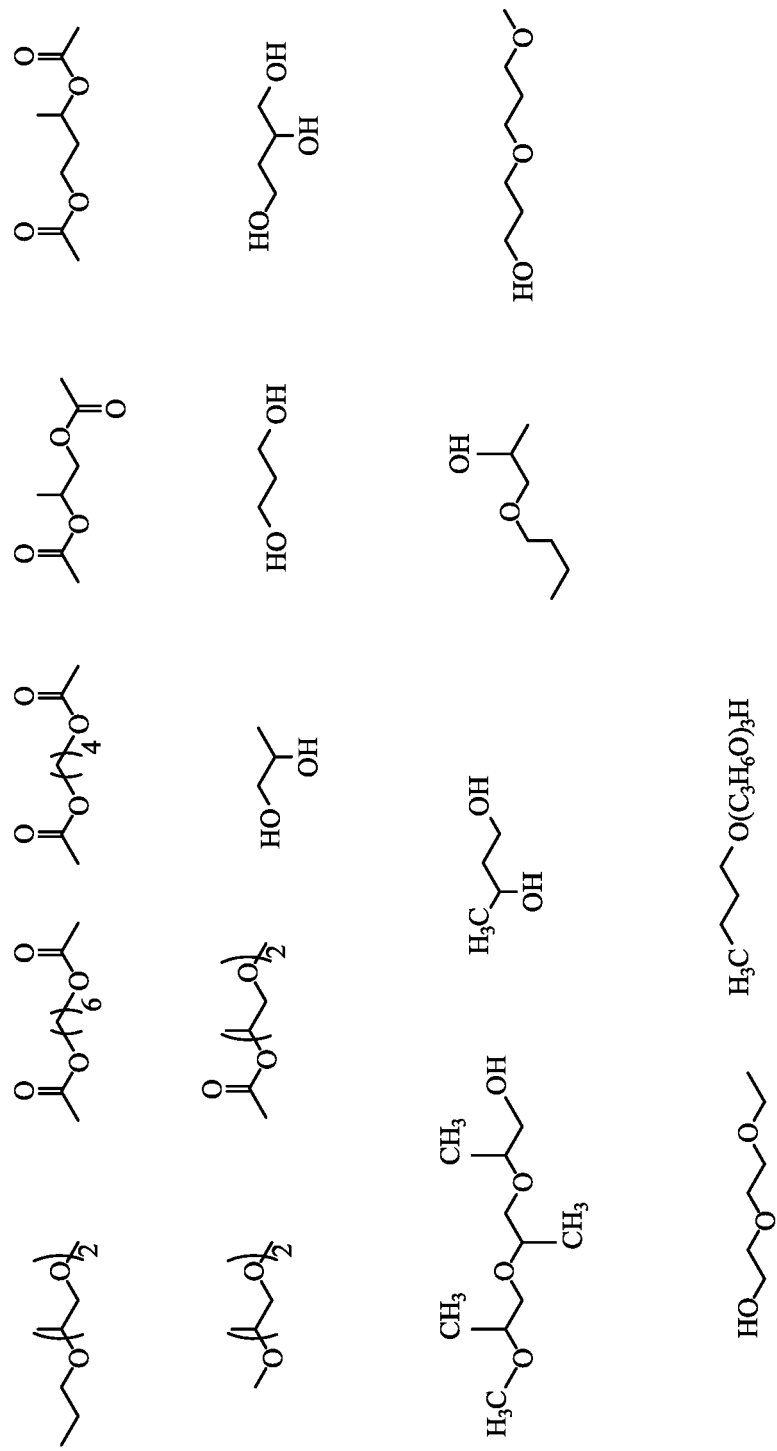
FIG. 21 illustrates examples of high boiling point solvents according to embodiments of the disclosure.

The high boiling point solvent has a boiling point greater than 100° C. In some embodiments, the high boiling point solvent includes one or more of cyclohexyl acetate, dipropylene glycol dimethyl ether, propylene glycol diacetate, dipropylene glycol methyl propylene ether, di(propylene glycol) methyl ether acetate, 1,4-diacetoxybutane, 1,3-butanediol diacetate, 1,6-diacetoxyhexane, tripropylene glycol methyl ether, 1,3-propanediol, propylene glycol, 1,3-butanediol, propylene glycol butyl ether, dipropylene glycol monomethyl ether, diethylene glycol monoethyl ether, di(propylene glycol) butyl ether, or tri(propylene glycol) butyl ether. FIG. 21 illustrates examples of high boiling point solvents according to embodiments of the disclosure. In some embodiments, the resist layer 15 is doped with the high boiling point solvent by applying the high boiling point solvent to the resist layer 15 as a liquid, vapor, or a mist.

In some embodiments, a concentration of the high boiling point solvent in the doped photoresist layer ranges from about 0.1 wt. % to about 20 wt. % based on the weight of the high boiling point solvent and the resist composition. At high boiling point solvent concentrations below the disclosed range there may not be a sufficient amount of the high boiling point solvent to provide a measurable improvement in the resist parameters or performance. At high boiling point solvent concentrations above the disclosed range there may not be a significant additional improvement in the resist parameters or performance.

In some embodiments, the organic or inorganic acid has a pK$_a$ of less than 7. The acid dissociation constant, pK$_a$, is the logarithmic constant of the acid dissociation constant K$_a$. K$_a$ is a quantitative measure of the strength of an acid in solution. K$_a$ is the equilibrium constant for the dissociation of a generic acid according to the equation HA+H$_2$O↔A$^-$+H$_3$O$^+$, where HA dissociates into its conjugate base, A$^-$, and a hydrogen ion which combines with a water molecule to form a hydronium ion. The dissociation constant can be expressed as a ratio of the equilibrium concentrations:

$$K_a = \frac{[A^-][H_3O^+]}{[HA][H_2O]}.$$

In most cases, the amount of water is constant and the equation can be simplified to $HA \leftrightarrow A^- + H^+$, and $$K_a = \frac{[A^-][H^+]}{[HA]}.$$

The logarithmic constant, $pK_a$ is related to $K_a$ by the equation $pK_a = -\log_{10}(K_a)$. The lower the value of $pK_a$ the stronger the acid. Conversely, the higher the value of $pK_a$ the stronger the base.

In some embodiments, suitable organic acids for dopant composition include an organic acid selected from the group consisting of formic acid, acetic acid, ethanedioic acid, 2-hydroxyethanoic acid, oxoethanoic acid, propanoic acid, propanedioic acid, 2-hydroxypropanoic acid, butanoic acid, 2-hydroxybutanedioic acid, butanedioic acid, 3-oxobutanoic acid, pentanoic acid, hexanoic acid, heptanoic acid, caprylic acid, citric acid, uric acid, trifluoromethanesulfonic acid, benzenesulfonic acid, ethanesulfonic acid, methanesulfonic acid, maleic acid, carbonic acid, hydroxylamine-o-sulfonic acid, formamidinesulfinic acid, methylsulfamic acid, sulfoacetic acid, 1,1,2,2-tetrafluoroethanesulfonic acid, 1,3-propanedisulfonic acid, nonafluorobutane-1-sulfonic acid, 5-sulfosalicylic acid, trichloroacetic acid, and combinations thereof. In some embodiments, suitable inorganic acids for the dopant composition include one or more of nitric acid, sulfuric acid, hydrofluoric acid, hydrochloric acid, phosphoric acid, hydrobromic acid, hydroiodic acid, perchloric acid, and combinations thereof.

In some embodiments, the organic or inorganic base has a $pK_a$ of greater than 7. In some embodiments, suitable bases for the dopant composition include an alkanolamine, a triazole, or an ammonium compound. In some embodiments, suitable bases include an organic base selected from the group consisting of monoethanolamine, monoisopropanolamine, 2-amino-2-methyl-1-propanol, 1H-benzotriazole, 1,2,4-triazole, 1,8-diazabicycloundec-7-ene, ammonium carbamate, tetramethylammonium hydroxide, tetraethylammonium hydroxide, tetrapropylammonium hydroxide, and tetrabutylammonium hydroxide, and $NHR_2$ and $NH_2R$, where R is a substituted or unsubstituted, aliphatic or aromatic C1-C15 group, and combinations thereof. In some embodiments, suitable inorganic bases for the dopant composition include a base selected from the group consisting of ammonium hydroxide, ammonium sulfamate, potassium hydroxide, sodium hydroxide, and combinations thereof.

In some embodiments, a concentration of the acid or base in the doped photoresist layer ranges from about 0.1 wt. % to about 20 wt. % based on the weight of the acid or base and the resist composition. At acid or base concentrations below the disclosed range there may not be a sufficient amount of the acid or base to provide a measurable improvement in the resist parameters or performance. At acid or base concentrations above the disclosed range there may not be a significant additional improvement in the resist parameters or performance.

In some embodiments, the resist layer 15 is doped with water by applying the water to the resist layer 15 as a liquid, vapor, or a mist. In some embodiments, a concentration of water in the doped photoresist layer ranges from about 0.1 wt. % to about 20 wt. % based on the weight of the water and the resist composition. At water concentrations below the disclosed range there may not be a sufficient amount of the water to provide a measurable improvement in the resist parameters or performance. At water concentrations above the disclosed range there may not be a significant additional improvement in the resist parameters or performance.

In some embodiments, the dopant is dissolved into or mixed with one or more solvents selected from the group consisting of propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), 2-heptanone (MAK), formic acid, acetic acid, propanoic acid, and butanoic acid.

In some embodiments, the dopant composition does not include a polymer. In some embodiments, the dopant composition does not include an organic polymer. In some embodiments, the dopant composition does not include an organic polymer with a nitrogen-containing moiety. Thus, in some embodiments, there are no organic polymers or organic polymers with a nitrogen-containing moiety in the dopant layer 20.

The photoresist layer 15 is a photosensitive layer that is patterned by exposure to actinic radiation. Typically, the chemical properties of the photoresist regions struck by incident radiation change in a manner that depends on the type of photoresist used. Photoresist layers 15 are positive tone resists or negative tone resists. A positive tone resist refers to a photoresist material that when exposed to actinic radiation (e.g., UV light) becomes soluble in a developer, while the region of the photoresist that is non-exposed (or exposed less) is insoluble in the developer. A negative tone resist, on the other hand, refers to a photoresist material that when exposed to actinic radiation becomes insoluble in the developer, while the region of the photoresist that is non-exposed (or exposed less) is soluble in the developer. The region of a negative tone resist that becomes insoluble upon exposure to radiation may become insoluble due to a cross-linking reaction caused by the exposure to radiation.

In some embodiments of the present disclosure, a negative tone photoresist is exposed to actinic radiation. The exposed portions of the negative tone photoresist undergo crosslinking because of the exposure to actinic radiation, and during development the unexposed, non-crosslinked portions of the photoresist are removed by the developer leaving the exposed regions of the photoresist remaining on the substrate.

In some embodiments, the photoresist layer 15 is a negative tone metallic photoresist that undergoes a cross-linking reaction upon exposure to the radiation.

In some embodiments, the photoresist layer 15 is made of a metallic photoresist composition, including a first compound or a first precursor and a second compound or a second precursor combined in a vapor state. The first precursor or first compound is an organometallic having a formula: $M_aR_bX_c$, as shown in FIG. 22A, where M is at least one of Sn, Bi, Sb, In, Te, Ti, Zr, Hf, V, Co, Mo, W, Al, Ga, Si, Ge, P, As, Y, La, Ce, or Lu; and R is a substituted or unsubstituted alkyl, alkenyl, or carboxylate group. In some embodiments, M is selected from the group consisting of Sn, Bi, Sb, In, Te, and combinations thereof. In some embodiments, R is a C3-C6 alkyl, alkenyl, or carboxylate. In some embodiments, R is selected from the group consisting of propyl, isopropyl, butyl, iso-butyl, sec-butyl, tert-butyl, pentyl, isopentyl, sec-pentyl, tert-pentyl, hexyl, iso-hexyl, sec-hexyl, tert-hexyl, and combinations thereof. X is a ligand, ion, or other moiety, which is reactive with the second compound or second precursor; and 1≤a≤2, b≥1, c≥1, and b+c≤5 in some embodiments. In some embodiments, the alkyl, alkenyl, or carboxylate group is substituted with one or more fluoro groups. In some embodiments, the organometallic precursor is a dimer, as shown in FIG. 22A, where each monomer unit is linked by an amine group. Each monomer has a formula: $M_aR_bX_c$, as defined above.

In some embodiments, R is alkyl, such as $C_nH_{2n+1}$ where n≥3. In some embodiments, R is fluorinated, e.g., having the formula $C_nF_xH_{((2n+1)-x)}$. In some embodiments, R has at least one beta-hydrogen or beta-fluorine. In some embodiments, R is selected from the group consisting of i-propyl, n-propyl, t-butyl, i-butyl, n-butyl, sec-butyl, n-pentyl, i-pentyl, t-pentyl, and sec-pentyl, and combinations thereof.

In some embodiments, X is any moiety readily displaced by the second compound or second precursor to generate an M-OH moiety, such as a moiety selected from the group consisting of amines (including dialkylamino and monalkylamino), alkoxy, carboxylates, halogens, and sulfonates. In some embodiments, the sulfonate group is substituted with one or more amine groups. In some embodiments, the halide is one or more selected from the group consisting of F, Cl, Br, and I. In some embodiments, the sulfonate group includes a substituted or unsubstituted C1-C3 group.

Figure 22B:
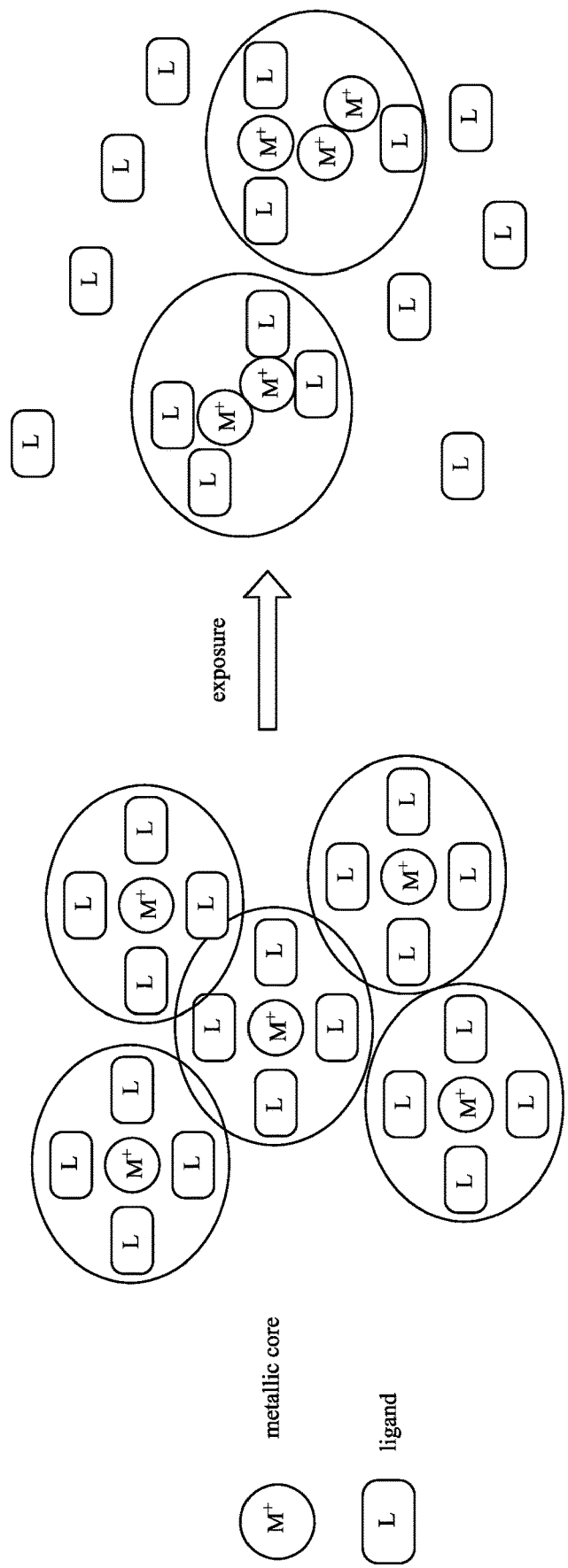
FIG. 22B shows a reaction the organometallic precursors undergo when exposed to actinic radiation.

In some embodiments, the first organometallic compound or first organometallic precursor includes a metallic core $M^+$ with ligands L attached to the metallic core $M^+$, as shown in FIG. 22B. In some embodiments, the metallic core $M^+$ is a metal oxide. The ligands L include C3-C12 aliphatic or aromatic groups in some embodiments. The aliphatic or aromatic groups may be unbranched or branched with cyclic, or noncyclic saturated pendant groups containing 1-9 carbons, including alkyl groups, alkenyl groups, and phenyl groups. The branched groups may be further substituted with oxygen or halogen. In some embodiments, the C3-C12 aliphatic or aromatic groups include heterocyclic groups. In some embodiments, the C3-C12 aliphatic or aromatic groups are attached to the metal by an ether or ester linkage. In some embodiments, the C3-C12 aliphatic or aromatic groups include nitrite and sulfonate substituents.

In some embodiments, the organometallic precursor or organometallic compound include a sec-hexyl tris(dimethylamino) tin, t-hexyl tris(dimethylamino) tin, i-hexyl tris(dimethylamino) tin, n-hexyl tris(dimethylamino) tin, sec-pentyl tris(dimethylamino) tin, t-pentyl tris(dimethylamino) tin, i-pentyl tris(dimethylamino) tin, n-pentyl tris(dimethylamino) tin, sec-butyl tris(dimethylamino) tin, t-butyl tris(dimethylamino) tin, i-butyl tris(dimethylamino) tin, n-butyl tris(dimethylamino) tin, sec-butyl tris(dimethylamino) tin, i-propyl tris(dimethylamino) tin, n-propyl tris(diethylamino) tin, and analogous alkyl tris(t-butoxy) tin compounds, including sec-hexyl tris(t-butoxy) tin, t-hexyl tris(t-butoxy) tin, i-hexyl tris(t-butoxy) tin, n-hexyl tris(t-butoxy) tin, sec-pentyl tris(t-butoxy), t-pentyl tris(t-butoxy) tin, i-pentyl tris(t-butoxy) tin, n-pentyl tris(t-butoxy) tin, t-butyl tris(t-butoxy) tin, i-butyl tris(butoxy) tin, n-butyl tris(butoxy) tin, sec-butyl tris(butoxy) tin, i-propyl tris(butoxy) tin, or n-propyl tris(butoxy) tin. In some embodiments, the organometallic precursors or organometallic compounds are fluorinated. In some embodiments, the organometallic precursors or compounds have a boiling point less than about 200° C.

In some embodiments, the first compound or first precursor includes one or more unsaturated bonds that can be coordinated with a functional group, such as a hydroxyl group, on the surface of the substrate or an intervening underlayer to improve adhesion of the photoresist layer to the substrate or underlayer.

In some embodiments, the second precursor or second compound is at least one of an amine, a borane, a phosphine, or water. In some embodiments, the amine has a formula $N_pH_nX_m$, where 0≤n≤3, 0≤m≤3, n+m=3 when p is 1, and n+m=4 when p is 2, and each X is independently a halogen selected from the group consisting of F, Cl, Br, and I. In some embodiments, the borane has a formula $B_pH_nX_m$, where 0≤n≤3, 0≤m≤3, n+m=3 when p is 1, and n+m=4 when p is 2, and each X is independently a halogen selected from the group consisting of F, Cl, Br, and I. In some embodiments, the phosphine has a formula $P_pH_nX_m$, where 0≤n≤3, 0≤m≤3, n+m=3, when p is 1, or n+m=4 when p is 2, and each X is independently a halogen selected from the group consisting of F, Cl, Br, and I.

FIG. 22B shows metallic precursors undergoing a reaction as a result of exposure to actinic radiation in some embodiments. As a result of exposure to the actinic radiation, ligand groups L are split off from the metallic core $M^+$ of the metallic precursors, and two or more metallic precursor cores bond with each other.

Figure 22C:
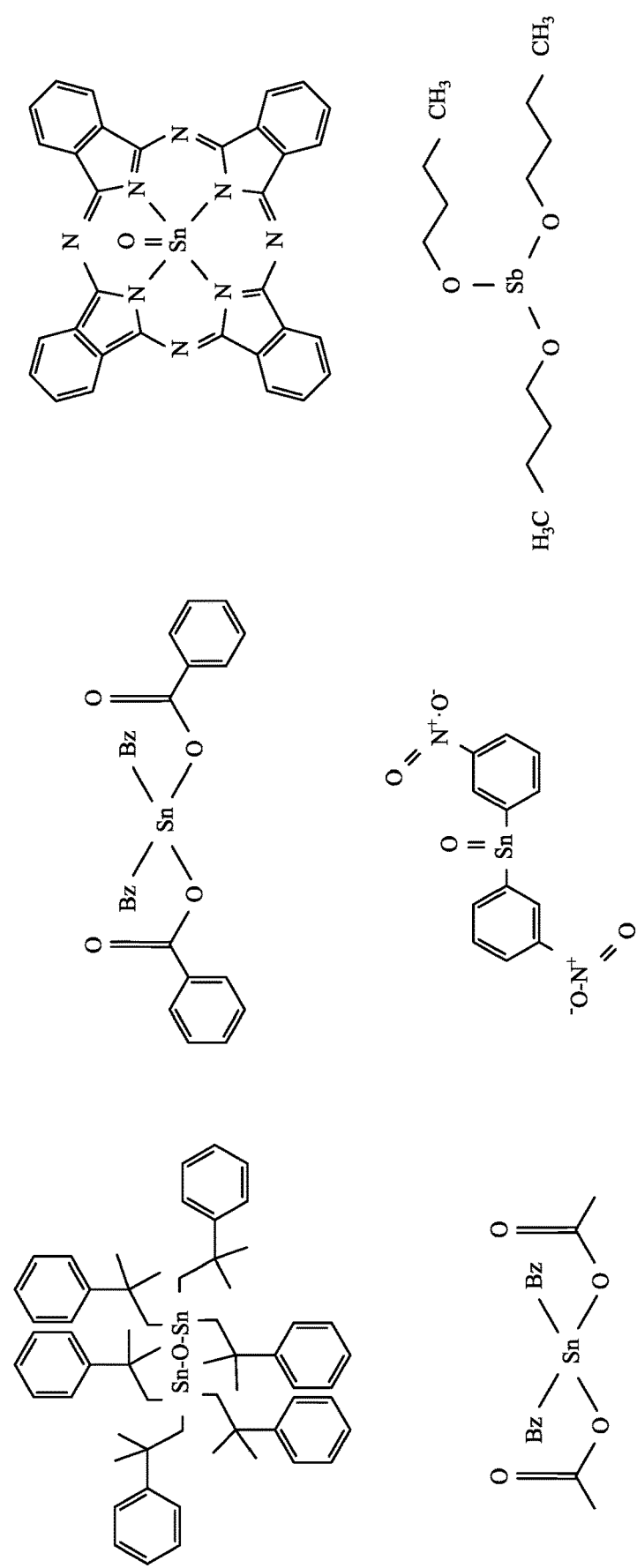
FIG. 22C shows examples of organometallic precursors according to embodiments of the disclosure.

FIG. 22C shows examples of organometallic precursors according to embodiments of the disclosure. In FIG. 22C, Bz is a benzene group.

In some embodiments, the operation S130 of depositing a photoresist composition is performed by a vapor phase deposition operation. In some embodiments, the vapor phase deposition operation includes atomic layer deposition (ALD) and chemical vapor deposition (CVD). In some embodiments, the ALD includes plasma-enhanced atomic layer deposition (PE-ALD); the CVD includes plasma-enhanced chemical vapor deposition (PE-CVD), metal-organic chemical vapor deposition (MO-CVD), atmospheric pressure chemical vapor deposition (AP-CVD), and low pressure chemical vapor deposition (LP-CVD).

Figure 23:
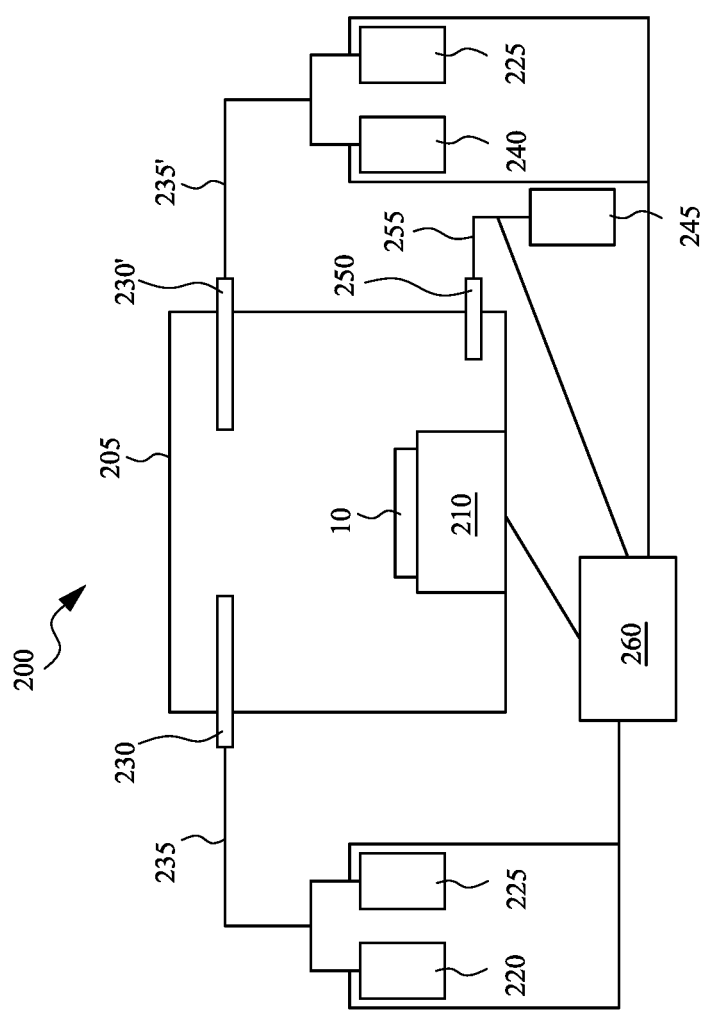
FIG. 23 illustrates a deposition apparatus according to embodiments of the disclosure.

A resist layer deposition apparatus 200 according to some embodiments of the disclosure is shown in FIG. 23. In some embodiments, the deposition apparatus 200 is an ALD or CVD apparatus. The deposition apparatus 200 includes a vacuum chamber 205. A substrate support stage 210 in the vacuum chamber 205 supports a substrate 10, such as silicon wafer. In some embodiments, the substrate support stage 210 includes a heater. A first precursor or compound gas supply 220 and carrier/purge gas supply 225 are connected to an inlet 230 in the chamber via a gas line 235, and a second precursor or compound gas supply 240 and carrier/purge gas supply 225 are connected to another inlet 230' in the chamber via another gas line 235' in some embodiments. The chamber is evacuated, and excess reactants and reaction byproducts are removed by a vacuum pump 245 via an outlet 250 and exhaust line 255. In some embodiments, the flow rate or pulses of precursor gases and carrier/purge gases, evacuation of excess reactants and reaction byproducts, pressure inside the vacuum chamber 205, and temperature of the vacuum chamber 205 or wafer support stage 210 are controlled by a controller 260 configured to control each of these parameters.

Depositing a photoresist layer includes combining the first compound or first precursor and the second compound or second precursor in a vapor state to form the photoresist composition in some embodiments. In some embodiments, the first compound or first precursor and the second compound or second precursor of the photoresist composition are introduced into the deposition chamber 205 (CVD chamber) at about the same time via the inlets 230, 230'. In some embodiments, the first compound or first precursor and second compound or second precursor are introduced into the deposition chamber 205 (ALD chamber) in an alternating manner via the inlets 230, 230', i.e.—first one compound or precursor then a second compound or precursor, and then subsequently alternately repeating the introduction of the one compound or precursor followed by the second compound or precursor.

In some embodiments, the deposition chamber temperature ranges from about 30° C. to about 400° C. during the deposition operation, and between about 50° C. to about 250° C. in other embodiments. In some embodiments, the pressure in the deposition chamber ranges from about 5 mTorr to about 100 Torr during the deposition operation, and between about 100 mTorr to about 10 Torr in other embodiments. In some embodiments, the plasma power is less than about 1000 W. In some embodiments, the plasma power ranges from about 100 W to about 900 W. In some embodiments, the flow rate of the first compound or precursor and the second compound or precursor ranges from about 100 sccm to about 1000 sccm. In some embodiments, the ratio of the flow of the organometallic compound precursor to the second compound or precursor ranges from about 1:1 to about 1:5. At operating parameters outside the above-recited ranges, unsatisfactory photoresist layers result in some embodiments. In some embodiments, the photoresist layer formation occurs in a single chamber (a one-pot layer formation).

In a CVD process according to some embodiments of the disclosure, two or more gas streams, in separate inlet paths 230, 235 and 230', 235', of an organometallic precursor and a second precursor are introduced to the deposition chamber 205 of a CVD apparatus, where they mix and react in the gas phase, to form a reaction product. The streams are introduced using separate injection inlets 230, 230' or a dual-plenum showerhead in some embodiments. The deposition apparatus is configured so that the streams of organometallic precursor and second precursor are mixed in the chamber, allowing the organometallic precursor and second precursor to react to form a reaction product. Without limiting the mechanism, function, or utility of the disclosure, it is believed that the product from the vapor-phase reaction becomes heavier in molecular weight, and is then condensed or otherwise deposited onto the substrate 10.

In some embodiments, an ALD process is used to deposit the photoresist layer. During ALD, a layer is grown on a substrate 10 by exposing the surface of the substrate to alternate gaseous compounds (or precursors). In contrast to CVD, the precursors are introduced as a series of sequential, non-overlapping pulses. In each of these pulses, the precursor molecules react with the surface in a self-limiting way, so that the reaction terminates once all the reactive sites on the surface are consumed. Consequently, the maximum amount of material deposited on the surface after a single exposure to all of the precursors (a so-called ALD cycle) is determined by the nature of the precursor-surface interaction.

In an embodiment of an ALD process, an organometallic precursor is pulsed to deliver the metal-containing precursor to the substrate 10 surface in a first half reaction. In some embodiments, the organometallic precursor reacts with a suitable underlying species (for example OH or NH functionality on the surface of the substrate) to form a new self-saturating surface. Excess unused reactants and the reaction by-products are removed, by an evacuation-pump down using a vacuum pump 245 and/or by a flowing an inert purge gas in some embodiments. Then, a second precursor, such as ammonia ($NH_3$), is pulsed to the deposition chamber in some embodiments. The $NH_3$ reacts with the organometallic precursor on the substrate to obtain a reaction product photoresist on the substrate surface. The second precursor also forms self-saturating bonds with the underlying reactive species to provide another self-limiting and saturating second half reaction. A second purge is performed to remove unused reactants and the reaction by-products in some embodiments. Pulses of the first precursor and second precursor are alternated with intervening purge operations until a desired thickness of the photoresist layer is achieved.

The resist layer deposition apparatus 200 illustrated in FIG. 23 is also used to form the dopant layer 20 in some embodiments.

In some embodiments, the photoresist layer 15 is formed to a thickness of about 5 nm to about 50 nm, and to a thickness of about 10 nm to about 30 nm in other embodiments. A person of ordinary skill in the art will recognize that additional ranges of thicknesses within the explicit ranges above are contemplated and are within the present disclosure. The thickness can be evaluated using non-contact methods of x-ray reflectivity and/or ellipsometry based on the optical properties of the photoresist layers. In some embodiments, each photoresist layer thickness is relatively uniform to facilitate processing. In some embodiments, the variation in thickness of the deposited photoresist layer varies by no more than ±25% from the average thickness, in other embodiments each photoresist layer thickness varies by no more than ±10% from the average photoresist layer thickness. In some embodiments, such as high uniformity depositions on larger substrates, the evaluation of the photoresist layer uniformity may be evaluated with a 1 centimeter edge exclusion, i.e., the layer uniformity is not evaluated for portions of the coating within 1 centimeter of the edge. A person of ordinary skill in the art will recognize that additional ranges within the explicit ranges above are contemplated and are within the present disclosure.

In some embodiments, the first and second compounds or precursors are delivered into the deposition chamber 205 with a carrier gas. The carrier gas, a purge gas, a deposition gas, or other process gas may contain nitrogen, hydrogen, argon, neon, helium, or combinations thereof.

In some embodiments, the organometallic compound includes tin (Sn), antimony (Sb), bismuth (Bi), indium (In), and/or tellurium (Te) as the metal component, however, the disclosure is not limited to these metals. In other embodiments, additional suitable metals include titanium (Ti), zirconium (Zr), hafnium (Hf), vanadium (V), cobalt (Co), molybdenum (Mo), tungsten (W), aluminum (Al), gallium (Ga), silicon (Si), germanium (Ge), phosphorus (P), arsenic (As), yttrium (Y), lanthanum (La), cerium (Ce), lutetium (Lu), or combinations thereof. The additional metals can be as alternatives to or in addition to the Sn, Sb, Bi, In, and/or Te.

The particular metal used may significantly influence the absorption of radiation. Therefore, the metal component can be selected based on the desired radiation and absorption cross section. Tin, antimony, bismuth, tellurium, and indium provide strong absorption of extreme ultraviolet light at 13.5 nm. Hafnium provides good absorption of electron beam and extreme UV radiation. Metal compositions including titanium, vanadium, molybdenum, or tungsten have strong absorption at longer wavelengths, to provide, for example, sensitivity to 248 nm wavelength ultraviolet light.

In some embodiments, the resist layer 15 is formed by mixing the organometallic compound in a solvent to form a resist composition and dispensing the resist composition onto the substrate 10. To aid in the mixing and dispensing of the photoresist, the solvent is chosen at least in part based upon the materials chosen for the metallic resist. In some embodiments, the solvent is chosen such that the organometallic is evenly dissolved into the solvent and dispensed upon the layer to be patterned.

In some embodiments, the resist solvent is an organic solvent, and includes any suitable solvent such as propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), 2-heptanone (MAK), formic acid, acetic acid, propanoic acid, butanoic acid, or the like.

As one of ordinary skill in the art will recognize, the materials listed and described above as examples of materials that may be used for the solvent component of the photoresist are merely illustrative and are not intended to limit the embodiments. Rather, any suitable material that dissolves the metallic photoresist material may be used to help mix and apply the photoresist. All such materials are fully intended to be included within the scope of the embodiments.

The dopant composition and photoresist composition are applied onto the layer to be patterned, as shown in FIGS. 2A and 2B, such as the substrate 10 to form the dopant layer 20 and the photoresist layer 15. In some embodiments, the dopant composition and the photoresist composition are applied using a process such as a spin-on coating process, a dip coating method, an air-knife coating method, a curtain coating method, a wire-bar coating method, a gravure coating method, a lamination method, an extrusion coating method, CVD, ALD, PVD, combinations of these, or the like. In some embodiments, the photoresist layer 15 thickness ranges from about 10 nm to about 300 nm. In some embodiments, the dopant layer 20 thickness ranges from about 5 nm to about 100 nm, and ranges from about 10 nm to about 50 nm in other embodiments.

After the photoresist layer 15 and dopant layer 20 have been applied to the substrate 10 and first and second baking operations (S120, S140) are performed as necessary, as discussed herein (see FIGS. 1A, 1B, 3A, and 3B), the doped photoresist layer 15a is selectively exposed to form an exposed region 50 and an unexposed region 52, as discussed herein, and shown in FIGS. 5A and 5B. In some embodiments, the exposure to radiation is carried out by placing the doped photoresist coated substrate in a photolithography tool. The photolithography tool includes a photomask 30, 65 optics, an exposure radiation source to provide the radiation 45, 97 for exposure, and a movable stage for supporting and moving the substrate under the exposure radiation.

The selectively exposed doped photoresist layer 15a is subsequently developed, as shown in FIG. 6. In some embodiments of the disclosure, the developer composition, includes: a first solvent having Hansen solubility parameters of $18>\delta_d>3$, $7>\delta_p>1$, and $7>\delta_h>1$; an organic acid having an acid dissociation constant, pKa, of $-11<pKa<4$; and a Lewis acid, wherein the organic acid and the Lewis acid are different. In some embodiments, the developer includes a base having a $pK_a$ of $40>pK_a>9.5$.

The units of the Hansen solubility parameters are (Joules/cm³)$^{1/2}$ or, equivalently, MPa$^{1/2}$ and are based on the idea that one molecule is defined as being like another if it bonds to itself in a similar way. $\delta_d$ is the energy from dispersion forces between molecules. $\delta_p$ is the energy from dipolar intermolecular force between the molecules. $\delta_h$ is the energy from hydrogen bonds between molecules. The three parameters, $\delta_d$, $\delta_p$, and $\delta_h$, can be considered as coordinates for a point in three dimensions, known as the Hansen space. The nearer two molecules are in Hansen space, the more likely they are to dissolve into each other.

In some embodiments, the concentration of the first solvent ranges from about 60 wt. % to about 99 wt. % based on a total weight of the developer composition. In some embodiments, the concentration of the first solvent is greater than 60 wt. %. In other embodiments, the concentration of the concentration of the first solvent ranges from about 70 wt. % to about 90 wt. % based on a total weight of the developer composition. In some embodiments, the first solvent is one or more of n-butyl acetate, methyl n-amyl ketone, hexane, heptane, and amyl acetate.

In some embodiments, the organic acid is one or more of ethanedioic acid, methanoic acid, 2-hydroxypropanoic acid, 2-hydroxybutanedioic acid, citric acid, uric acid, trifluoromethanesulfonic acid, benzenesulfonic acid, ethanesulfonic acid, methanesulfonic acid, and maleic acid. In some embodiments, the concentration of the organic acid is about 0.001 wt. % to about 30 wt. % based on a total weight of the developer composition.

In some embodiments, suitable bases for the photoresist developer composition 57 include an alkanolamine, a triazole, or an ammonium compound. In some embodiments, suitable bases include an organic base selected from the group consisting of monoethanolamine, monoisopropanolamine, 2-amino-2-methyl-1-propanol, 1H-benzotriazole, 1,2,4-triazole, 1,8-diazabicycloundec-7-ene, tetramethylammonium hydroxide, tetraethylammonium hydroxide, tetrapropylammonium hydroxide, and tetrabutylammonium hydroxide, and combinations thereof; or inorganic bases selected from the group consisting of ammonium hydroxide, ammonium sulfamate, ammonium carbamate, and combinations thereof or inorganic bases selected from the group consisting of ammonium hydroxide, ammonium sulfamate, ammonium carbamate, and combinations thereof. In some embodiments, the base is selected from the group consisting of monoisopropanolamine, 2-amino-2-methyl-1-propanol, 1H-benzotriazole, 1,2,4-triazole, 1,8-diazabicycloundec-7-ene, and combinations thereof. In some embodiments, the concentration of the base is about 0.001 wt. % to about 30 wt. % based on a total weight of the developer composition.

In some embodiments, the concentration of the Lewis acid is about 0.1 wt. % to about 15 wt. % based on a total weight of the developer composition, and in other embodiments, the concentration of the Lewis acid is about 1 wt. % to about 5 wt. % based on a total weight of the developer composition.

In some embodiments, the developer composition includes a second solvent having Hansen solubility parameters of $25>\delta_d>13$, $25>\delta_p>3$, and $30>\delta_h>4$, and the first solvent and the second solvent are different solvents. In some embodiments, the concentration of the second solvent ranges from about 0.1 wt. % to less than about 40 wt. % based on a total weight of the developer composition. In some embodiments, the second solvent is one or more of propylene glycol methyl ether, propylene glycol ethyl ether, γ-butyrolactone, cyclohexanone, ethyl lactate, methanol, ethanol, propanol, n-butanol, acetone, dimethyl formamide, acetonitrile, isopropanol, tetrahydrofuran, or acetic acid.

In some embodiments, the developer composition includes about 0.001 wt. % to about 30 wt. % of a chelate based on the total it of the developer composition. In other embodiments, the developer composition includes about 0.1 wt. % to about 20 wt. % of the chelate based on the total weight of the developer composition. In some embodiments, the chelate is one or more of ethylenediaminetetraacetic acid (EDTA), ethylenediamine-N,N'-disuccinic acid (EDDS), diethylenetriaminepentaacetic acid (DTPA), polyaspartic acid, trans-1,2-cyclohexanediamine-N,N,N',N'-tetraacetic acid monohydrate, ethylenediamine, or the like.

In some embodiments, the developer composition includes water or ethylene glycol at a concentration of about 0.001 wt. % to about 30 wt. % based on a total weight of the developer composition.

In some embodiments, the photoresist developer composition includes a surfactant in a concentration range of from about 0.001 wt. % to about less than 5 wt. % based on a total weight of the developer composition to increase the solubility and reduce the surface tension on the substrate. In other embodiments, the concentration of the surfactant ranges from about 0.01 wt. % to about 1 wt. % based on the total weight of the developer composition.

At concentrations of the developer composition components outside the disclosed ranges, developer composition performance and development efficiency may be reduced, leading to increased photoresist residue and scum in the photoresist pattern, and increased line width roughness and line edge roughness.

In some embodiments, the developer 57 is applied to the photoresist layer 15 using a spin-on process. In the spin-on process, the developer 57 is applied to the photoresist layer 15 from above the photoresist layer 15 while the photoresist coated substrate is rotated, as shown in FIG. 6. In some embodiments, the developer 57 is supplied at a rate of between about 5 ml/min and about 800 ml/min, while the photoresist coated substrate 10 is rotated at a speed of between about 100 rpm and about 2000 rpm. In some embodiments, the developer is at a temperature of between about 20° C. and about 75° C. during the development operation. The development operation continues for between about 10 seconds to about 10 minutes in some embodiments.

While the spin-on operation is one suitable method for developing the photoresist layer 15 after exposure, it is intended to be illustrative and is not intended to limit the embodiment. Rather, any suitable development operations, including dip processes, puddle processes, and spray-on methods, may alternatively be used. All such development operations are included within the scope of the embodiments.

During the development process, the developer composition 57 dissolves the photoresist regions 52 not exposed to radiation (i.e.—not crosslinked), exposing the surface of the substrate 10, as shown in FIG. 7, and leaving behind well-defined exposed photoresist regions 50, having improved definition than provided by conventional negative tone photoresist photolithography.

After the developing operation S170, remaining developer is removed from the patterned photoresist covered substrate. The remaining developer is removed using a spin-dry process in some embodiments, although any suitable removal technique may be used. After the photoresist layer 15 is developed, and the remaining developer is removed, additional processing is performed while the patterned photoresist layer 50 is in place. For example, an etching operation, using dry or wet etching, is performed in some embodiments, to transfer the pattern of the photoresist layer 50 to the underlying substrate 10, forming recesses 55' as shown in FIG. 8. The substrate 10 has a different etch resistance than the photoresist layer 15. In some embodiments, the etchant is more selective to the substrate 10 than the photoresist layer 15.

Figure 24B:
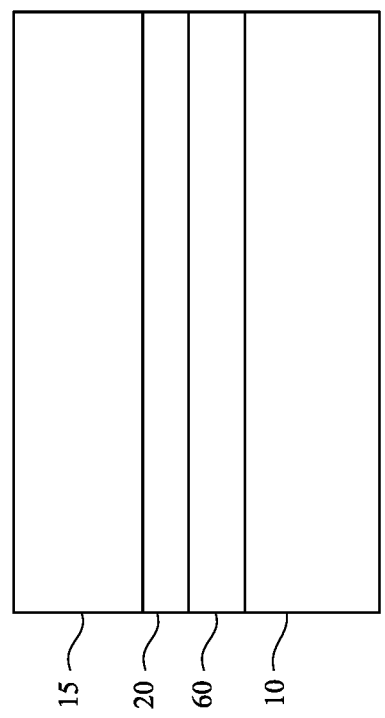
FIGS. 24A and 24B show process stages of a sequential operation according to embodiments of the disclosure.
Figure 24A:
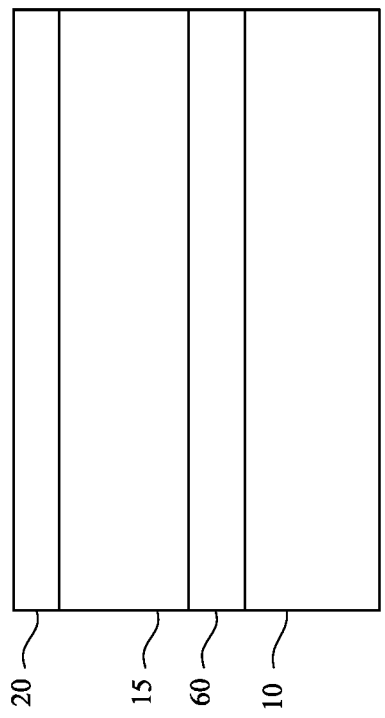

In some embodiments, a layer to be patterned (target layer) 60 is disposed over the substrate prior to forming the dopant layer 20 and the photoresist layer 15, as shown in FIGS. 24A and 24B. Baking operations S120 are performed, as necessary to dry and cure the dopant layer 20 and photoresist layer 15, as discussed herein in reference to FIGS. 1A, 1B, 2A, and 2B. In some embodiments, the target layer 60 is a metallization layer or a dielectric layer, such as a passivation layer, disposed over a metallization layer. In embodiments where the target layer 60 is a metallization layer, the target layer 60 is formed of a conductive material using metallization processes, and metal deposition techniques, including chemical vapor deposition, atomic layer deposition, and physical vapor deposition (sputtering). Likewise, if the target layer 60 is a dielectric layer, the target layer 60 is formed by dielectric layer formation techniques, including thermal oxidation, CVD, ALD, and PVD.

Figure 25B:
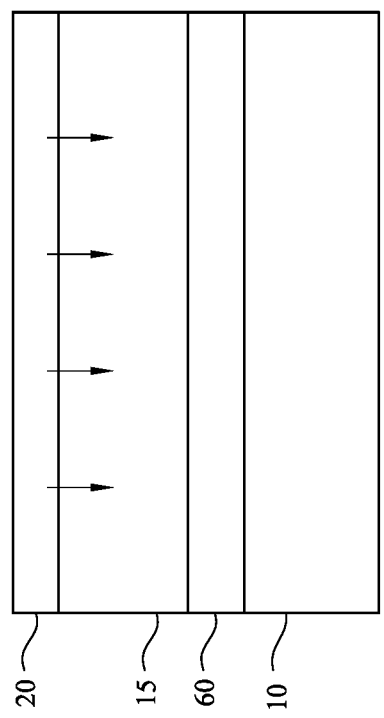
FIGS. 25A and 25B show process stages of a sequential operation according to embodiments of the disclosure.
Figure 25A:
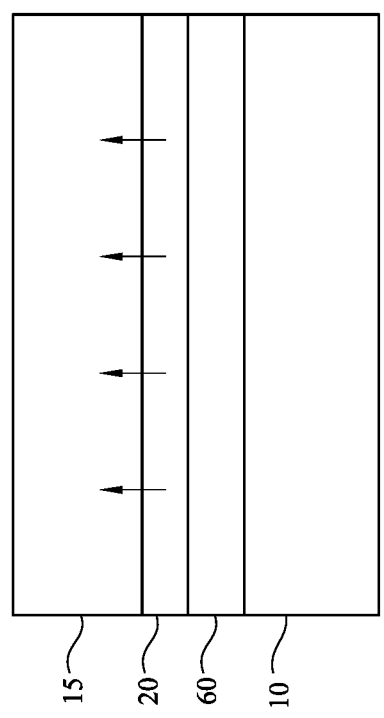
Figure 26:
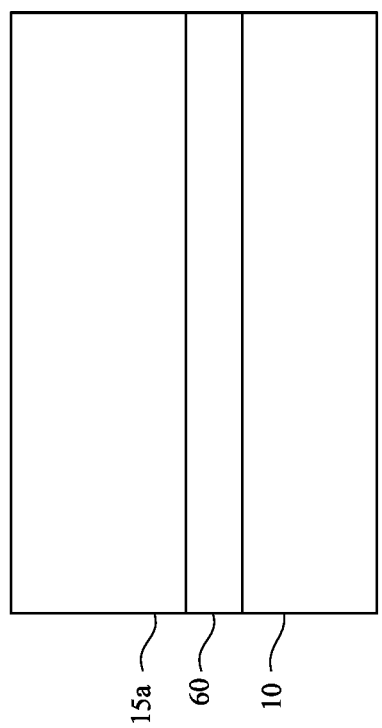
FIG. 26 shows a process stage of a sequential operation according to an embodiment of the disclosure.

As shown in FIGS. 25A and 25B, a pre-exposure bake (S140) is performed to diffuse the dopant into the photoresist layer 15, as discussed herein in reference to FIGS. 3A and 3B, to form the doped photoresist layer 15a, as shown in FIG. 26, and as discussed herein in reference to FIG. 4 (see FIGS. 1A and 1B).

Figure 27A:
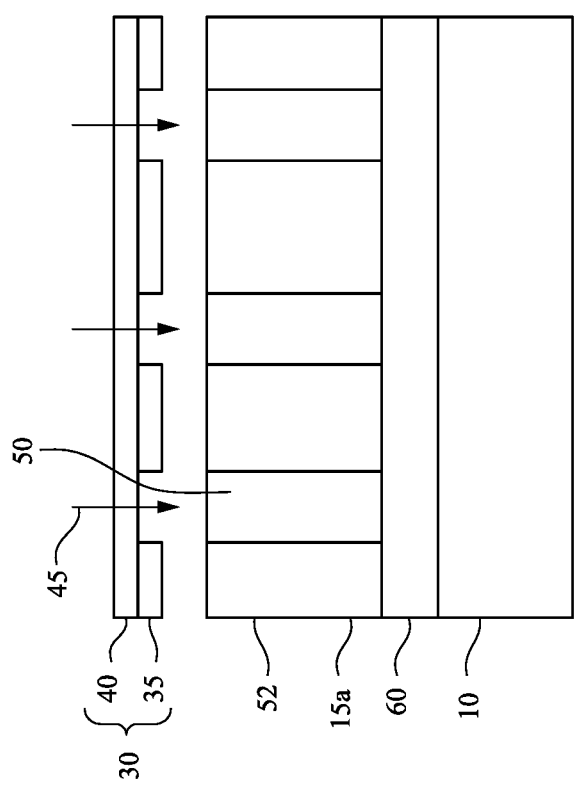
FIGS. 27A and 27B show process stages of a sequential operation according to embodiments of the disclosure.
Figure 27B:
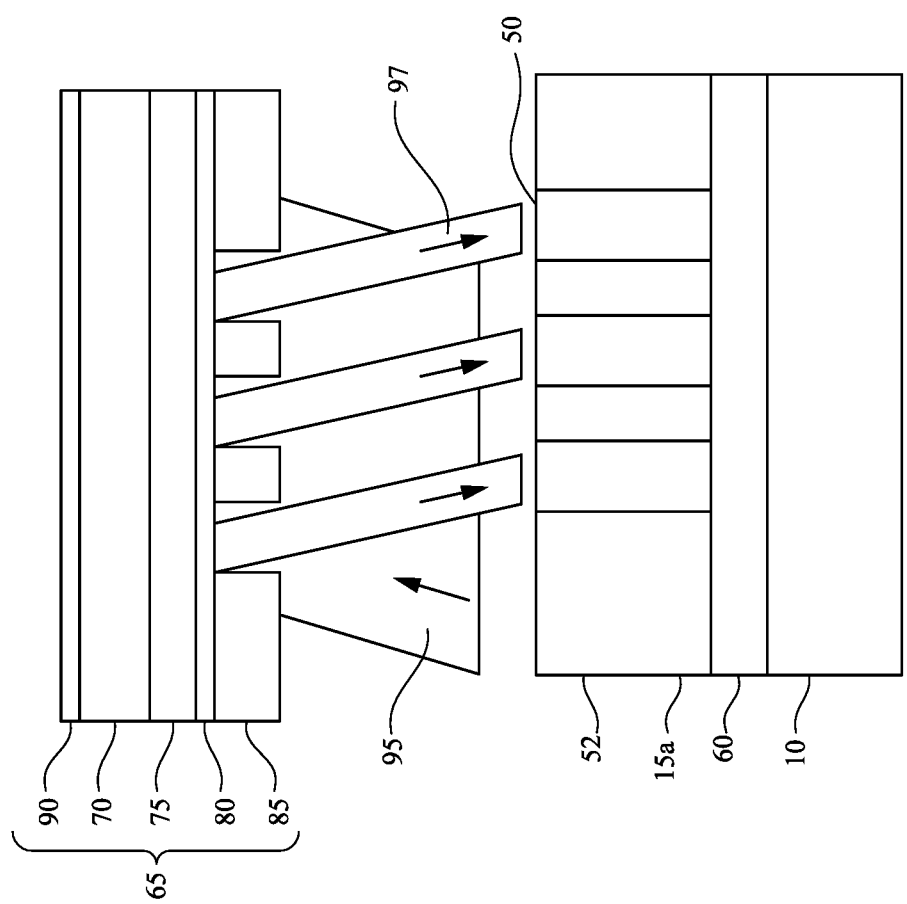

The doped photoresist layer 15a is subsequently selectively exposed to actinic radiation 45, 97 to form exposed regions 50 and unexposed regions 52 in the doped photoresist layer, as shown in FIGS. 27A and 27B, and described herein in relation to FIGS. 5A and 5B. As explained herein the photoresist is a negative photoresist, wherein crosslinking occurs in the exposed regions 50 in some embodiments.

Figure 28:
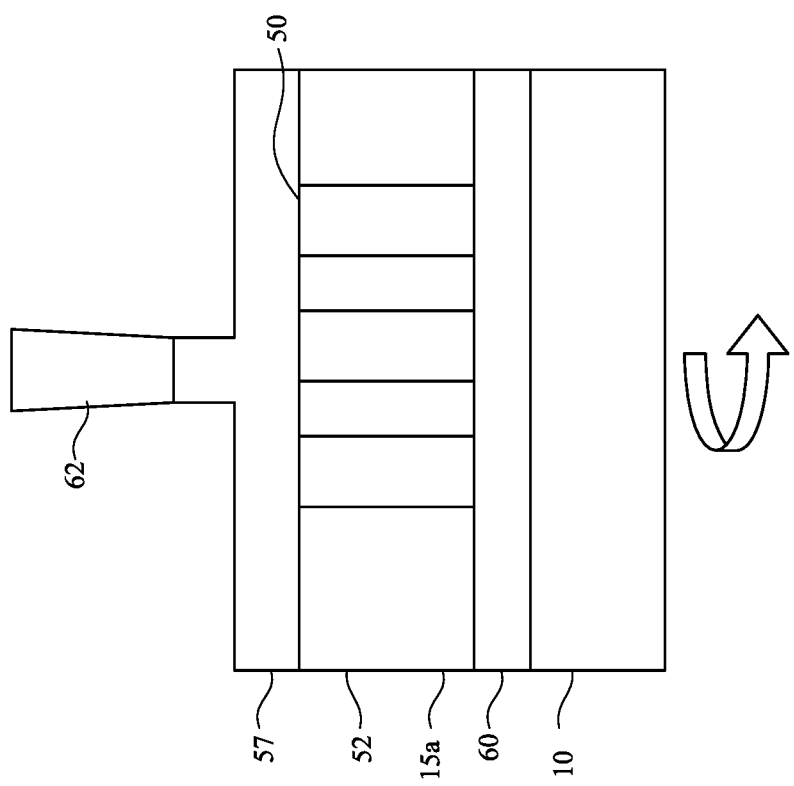
FIG. 28 shows a process stage of a sequential operation according to an embodiment of the disclosure.
Figure 29:
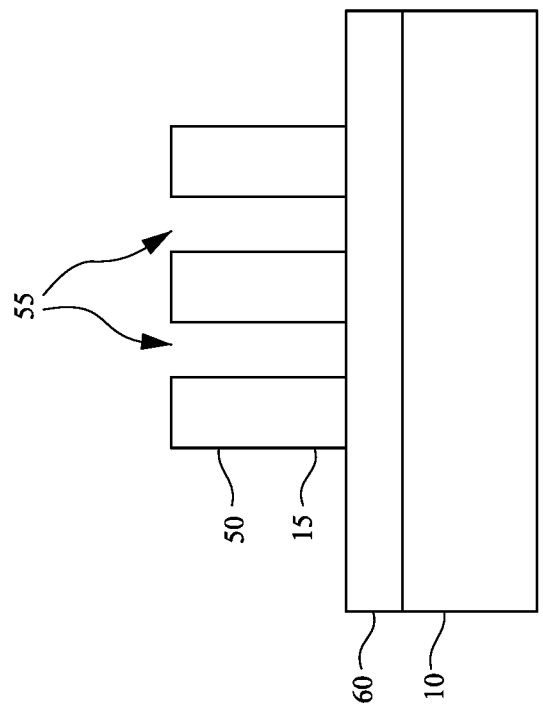
FIG. 29 shows a process stage of a sequential operation according to an embodiment of the disclosure.

As shown in FIG. 28, the selectively exposed photoresist layer 50, 52 is developed by dispensing developer 57 from a dispenser 62 to form a pattern of photoresist openings 55, as shown in FIG. 29. The development operation is similar to that explained with reference to FIGS. 6 and 7, herein.

Figure 30:
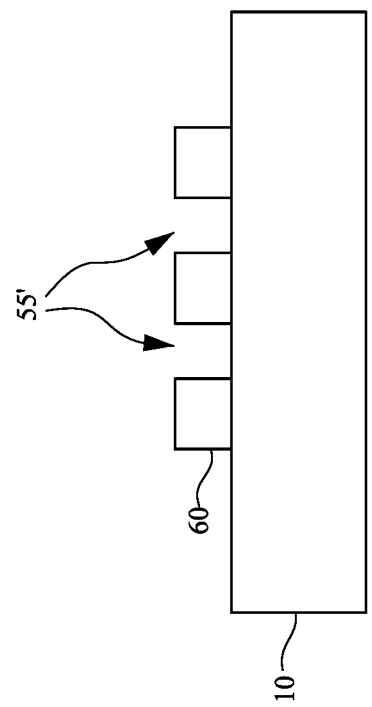
FIG. 30 shows a process stage of a sequential operation according to an embodiment of the disclosure.

Then as shown in FIG. 30, the pattern 55 in the photoresist layer 15 is transferred to the target layer 60 using an etching operation and the photoresist layer is removed, as explained with reference to FIG. 8 to form pattern 55" in the target layer 60.

Other embodiments include other operations before, during, or after the operations described above. In some embodiments, the disclosed methods include forming fin field effect transistor (FinFET) structures. In some embodiments, a plurality of active fins are formed on the semiconductor substrate. Such embodiments, further include etching the substrate through the openings of a patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In some embodiments, one or more gate electrodes are formed on the substrate. Some embodiments include forming gate spacers, doped source/drain regions, contacts for gate/source/drain features, etc. In other embodiments, a target pattern is formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer.

The above are non-limiting examples of devices/structures that can be made and/or improved using the method described herein.

In some embodiments, active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, FinFETs, other three-dimensional (3D) FETs, other memory cells, and combinations thereof are formed, according to embodiments of the disclosure.

The novel doping techniques and semiconductor manufacturing methods according to the present disclosure provide higher semiconductor device feature density with reduced defects in a higher efficiency process than conventional methods. The novel techniques and methods reduce LWR to less than 5.0 nm, and reduce the exposure dose of the photoresist to less than 70 mj in some embodiments. The improvement in LWR and critical dimension uniformity (CDU) is greater than 3% in embodiments of the disclosure over conventional manufacturing methods. In some embodiments, the exposure dose is reduced by greater than 3% over conventional manufacturing methods. The defect rate is reduced by greater than 5% over conventional manufacturing methods in embodiments of the disclosure.

An embodiment of the disclosure is a method of manufacturing a semiconductor device including forming a dopant layer including a dopant composition over a substrate. A resist layer including a resist composition is formed over the dopant layer. A dopant is diffused from the dopant composition in the dopant layer into the resist layer; and a pattern is formed in the resist layer. In an embodiment, the diffusing a dopant includes heating the dopant layer and the resist layer at a temperature ranging from 40° C. to 250° C. In an embodiment, the forming a dopant layer includes applying a dopant composition including a dopant and a solvent over the substrate. In an embodiment, the forming a resist layer includes a chemical vapor deposition, a physical vapor deposition, or an atomic layer deposition operation. In an embodiment, the dopant composition includes one or more of a photoacid generator, a quencher, a photobase generator, an organic acid, an inorganic acid, an organic base, an inorganic base, a crosslinker, a surfactant, a solvent having a boiling point greater than 100° C., water, or a chelate. In an embodiment, the method includes heating the dopant layer at a temperature ranging from 80° C. to 250° C. before forming the resist layer. In an embodiment, the resist composition includes an organometallic compound.

Another embodiment of the disclosure is a method of manufacturing a semiconductor device including forming a metallic resist layer including a metallic resist composition over a substrate. A dopant layer including a dopant composition is formed over the metallic resist layer. A dopant is diffused from the dopant layer into the metallic resist layer, and a pattern is formed in the metallic resist layer. In an embodiment, the diffusing a dopant includes heating the dopant layer and the metallic resist layer at a temperature ranging from 40° C. to 250° C. In an embodiment, the dopant layer is formed in a vacuum chamber at a pressure less than atmospheric pressure. In an embodiment, the dopant composition includes one or more of a photoacid generator, a quencher, a photobase generator, an organic acid, an inorganic acid, an organic base, an inorganic base, a crosslinker, a surfactant, a solvent having a boiling point greater than 100° C., water, or a chelate. In an embodiment, the dopant layer is formed in a vacuum chamber at a pressure less than atmospheric pressure. In an embodiment, the method includes heating the dopant layer at a temperature ranging from 80° C. to 250° C. In an embodiment, the metallic resist composition includes an organometallic compound.

Another embodiment of the disclosure is a method of manufacturing a semiconductor device including forming a dopant layer including a dopant composition over a substrate. A photoresist layer is formed by a vapor phase deposition technique over the substrate. A dopant is transferred from the dopant layer into the photoresist layer. The photoresist layer is selectively exposed to actinic radiation to form a latent pattern in the photoresist layer, and the selectively exposed photoresist layer is developed to form a pattern in the photoresist layer. In an embodiment, the dopant layer is formed by a vapor phase deposition technique. In an embodiment, the transferring a dopant from the dopant layer into the photoresist layer includes heating the dopant layer and the photoresist layer at a temperature ranging from 40° C. to 250° C. In an embodiment, the vapor deposition technique is selected from the group consisting of chemical vapor deposition, physical vapor deposition, and atomic layer deposition. In an embodiment, the dopant composition includes one or more of a photoacid generator, a quencher, a photobase generator, an organic acid, an inorganic acid, an organic base, an inorganic base, a crosslinker, a surfactant, a solvent having a boiling point greater than 100° C., water, or a chelate. In an embodiment, the actinic radiation is extreme ultraviolet radiation or an electron beam.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   forming a dopant layer comprising a dopant composition over a substrate,
   wherein the dopant composition comprises one or more of a photoacid generator, an organic acid, an inorganic acid, an inorganic base, a crosslinker, or a surfactant;
   forming a resist composition including a reaction product of an organometallic precursor and an amine, a borane, a phosphine, or water,
   wherein the organometallic precursor has a formula:
   $M_aR_bX_c$, where: M is at least one of Sn, Bi, Sb, In, Te, Ti, Zr, Hf, V, Co, Mo, W, Al, Ga, Si, Ge, P, As, Y, La, Ce, or Lu; R is a substituted or unsubstituted alkyl, alkenyl, or carboxylate group; X is selected from the group consisting of an amino group, an alkoxy group, a carboxylate group, a halogen, and a sulfonate group; and $1 \leq a \leq 2$, $b \geq 1$, $c \geq 1$, and $b+c \leq 5$;
   forming a resist layer comprising the resist composition over the dopant layer;
   diffusing a dopant from the dopant composition in the dopant layer into the resist layer; and
   forming a pattern in the resist layer.

2. The method according to claim 1, wherein the diffusing a dopant comprises heating the dopant layer and the resist layer at a temperature ranging from 40° C. to 250° C.

3. The method according to claim 1, wherein the forming a dopant layer comprises applying a dopant composition comprising a dopant and a solvent over the substrate.

4. The method according to claim 1, wherein the forming a resist layer comprises a chemical vapor deposition, physical vapor deposition, or atomic layer deposition operation.

5. The method according to claim 1, wherein the dopant composition comprises one or more of an inorganic acid, an inorganic base, a crosslinker, or a surfactant.

6. The method according to claim 1, further comprising heating the dopant layer at a temperature ranging from 80° C. to 250° C. before forming the resist layer.

7. The method according to claim 1, wherein the organometallic precursor includes at least one of Sn, Bi, Sb, In, and Te.

8. A method of manufacturing a semiconductor device, comprising:
forming a metallic photoresist composition including a reaction product of an organometallic precursor and an amine, a borane, a phosphine, or water,
wherein the organometallic precursor has a formula:
$M_aR_bX_c$, where: M is at least one of Sn, Bi, Sb, In, Te, Ti, Zr, Hf, V, Co, Mo, W, Al, Ga, Si, Ge, P, As, Y, La, Ce, or Lu; R is a substituted or unsubstituted alkyl, alkenyl, or carboxylate group; X is selected from the group consisting of an amino group, an alkoxy group, a carboxylate group, a halogen, and a sulfonate group; and $1 \leq a \leq 2$, $b \geq 1$, $c \geq 1$, and $b+c \leq 5$;
forming a metallic photoresist layer comprising the metallic photoresist composition over a substrate;
forming a dopant layer comprising a dopant composition over the metallic photoresist layer,
wherein the dopant composition comprises one or more of an organic acid, an inorganic acid, an inorganic base, a crosslinker, a surfactant, or a chelate;
diffusing a dopant from the dopant layer into the metallic photoresist layer; and
forming a pattern in the metallic photoresist layer.

9. The method according to claim 8, wherein the diffusing a dopant comprises heating the dopant layer and the metallic photoresist layer at a temperature ranging from 40° C. to 250° C.

10. The method according to claim 8, wherein the dopant layer is formed in a vacuum chamber at a pressure less than atmospheric pressure.

11. The method according to claim 8, wherein the dopant composition comprises one or more of an inorganic acid, an inorganic base, a crosslinker, or a surfactant.

12. The method according to claim 8, further comprising heating the dopant layer at a temperature ranging from 80° C. to 250° C.

13. The method according to claim 8, wherein the metallic photoresist composition comprises an organometallic compound.

14. The method according to claim 8, wherein the forming a dopant layer comprises:
forming a mixture of the dopant and a solvent; and
applying the mixture over the metallic photoresist layer.

15. A method of manufacturing a semiconductor device, comprising:
forming a dopant layer comprising a dopant composition over a substrate,
wherein the dopant composition comprises one or more of a photoacid generator, an organic acid, an inorganic acid, an inorganic base, a crosslinker, or a surfactant;
forming a photoresist layer by a vapor phase deposition technique over the substrate,
wherein the vapor phase deposition technique includes reacting an organometallic precursor and an amine, a borane, a phosphine, or water,
wherein the organometallic precursor has a formula:
$M_aR_bX_c$, where: M is at least one of Sn, Bi, Sb, In, Te, Ti, Zr, Hf, V, Co, Mo, W, Al, Ga, Si, Ge, P, As, Y, La, Ce, or Lu; R is a substituted or unsubstituted alkyl, alkenyl, or carboxylate group; X is selected from the group consisting of an amino group, an alkoxy group, a carboxylate group, a halogen, and a sulfonate group; and $1 \leq a \leq 2$, $b \geq 1$, $c \geq 1$, and $b+c \leq 5$;
transferring a dopant from the dopant layer into the photoresist layer;
selectively exposing the photoresist layer to actinic radiation to form a latent pattern in the photoresist layer; and
developing the selectively exposed photoresist layer to form a pattern in the photoresist layer.

16. The method according to claim 15, wherein the dopant layer is formed by a vapor phase deposition technique.

17. The method according to claim 15, wherein the transferring a dopant from the dopant layer into the photoresist layer comprises heating the dopant layer and the photoresist layer at a temperature ranging from 40° C. to 250° C.

18. The method according to claim 15, wherein the vapor deposition technique is selected from the group consisting of chemical vapor deposition and atomic layer deposition.

19. The method according to claim 15, wherein the dopant composition comprises one or more of an inorganic acid, an inorganic base, a crosslinker, or a surfactant.

20. The method according to claim 15, wherein the actinic radiation is extreme ultraviolet radiation or an electron beam.

* * * * *